(12) United States Patent
Tanabe

(10) Patent No.: US 12,316,290 B2
(45) Date of Patent: May 27, 2025

(54) SIGNAL PROCESSING APPARATUS, SIGNAL PROCESSING METHOD, AND RECEIVING APPARATUS

(71) Applicant: Sony Semiconductor Solutions Corporation, Kanagawa (JP)

(72) Inventor: Shinichi Tanabe, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 229 days.

(21) Appl. No.: 18/044,733

(22) PCT Filed: Sep. 2, 2021

(86) PCT No.: PCT/JP2021/032229
§ 371 (c)(1),
(2) Date: Mar. 9, 2023

(87) PCT Pub. No.: WO2022/059496
PCT Pub. Date: Mar. 24, 2022

(65) Prior Publication Data
US 2023/0344396 A1    Oct. 26, 2023

(30) Foreign Application Priority Data
Sep. 16, 2020  (JP) ................. 2020-155473

(51) Int. Cl.
*H03G 3/30* (2006.01)
*H04B 1/16* (2006.01)

(52) U.S. Cl.
CPC ............ *H03G 3/3036* (2013.01); *H04B 1/16* (2013.01); *H03G 2201/103* (2013.01); *H03G 2201/307* (2013.01)

(58) Field of Classification Search
CPC .......... H03G 3/3036; H03G 2201/103; H03G 2201/307; H04B 1/16
See application file for complete search history.

(56) References Cited

U.S. PATENT DOCUMENTS 5,659,582 A    8/1997 Kojima
6,169,638 B1 *  1/2001 Morling ................... H03G 3/30
(Continued)

FOREIGN PATENT DOCUMENTS

CN    101060516 A    10/2007
CN    107809258 B    3/2020
(Continued)

OTHER PUBLICATIONS

International Search Report (PCT/ISA/210), International Application No. PCT/JP2021/032229, dated Nov. 9, 2021.

*Primary Examiner* — Freshteh N Aghdam
(74) *Attorney, Agent, or Firm* — Michael Best & Friedrich LLP

(57) ABSTRACT

The present technique pertains to a signal processing apparatus, a signal processing method, and a receiving apparatus that enable gain control to be appropriately performed on various interfering signals.
An amplifier controls a gain according to a count value to amplify a signal, and a comparator compares the signal outputted by the amplifier with the count value. An accumulator counts the count value according to an output from the comparator. The present technique can be applied to, for example, a receiving apparatus that receives an RF signal for a television broadcast.

16 Claims, 19 Drawing Sheets

(56) References Cited

U.S. PATENT DOCUMENTS

| | | | |
|---|---|---|---|
| 6,873,833 B2* | 3/2005 | Yang | H04M 3/40 |
| | | | 455/240.1 |
| 7,324,037 B1* | 1/2008 | Tan | H03M 1/182 |
| | | | 342/357.77 |
| 7,880,542 B1* | 2/2011 | Gilbert | H03F 1/0277 |
| | | | 330/279 |
| 2004/0178851 A1* | 9/2004 | Ishida | H03G 3/3036 |
| | | | 330/279 |
| 2005/0260964 A1 | 11/2005 | Wagner | |
| 2006/0044065 A1 | 3/2006 | Ishida | |
| 2008/0218268 A1 | 9/2008 | Ishida | |
| 2010/0156635 A1 | 6/2010 | Brown | |
| 2012/0076246 A1 | 3/2012 | Okada | |
| 2012/0164965 A1 | 6/2012 | Solum | |

FOREIGN PATENT DOCUMENTS

| | | |
|---|---|---|
| JP | H0779124 A | 3/1995 |
| JP | 2010016749 A | 1/2010 |
| JP | 2010507957 A | 3/2010 |
| JP | 2011024145 A | 2/2011 |
| JP | 2018157394 A | 10/2018 |
| TW | 200803218 A | 1/2008 |

\* cited by examiner

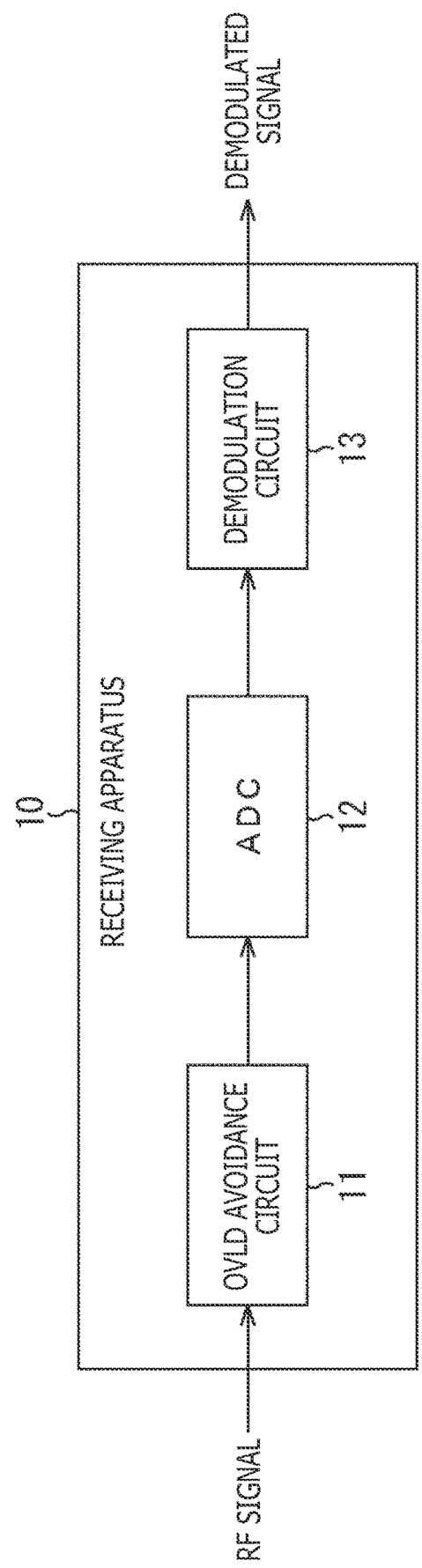

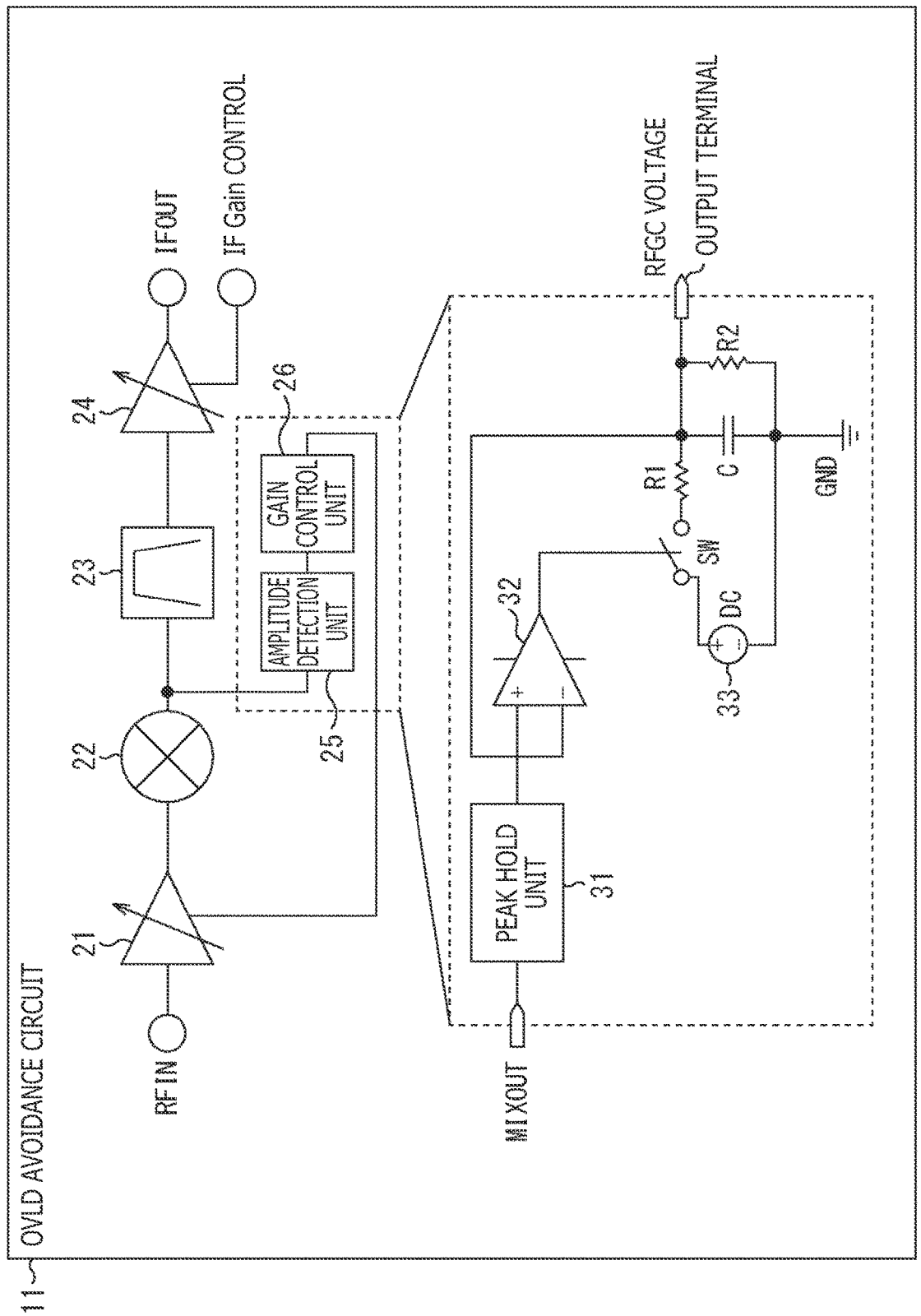

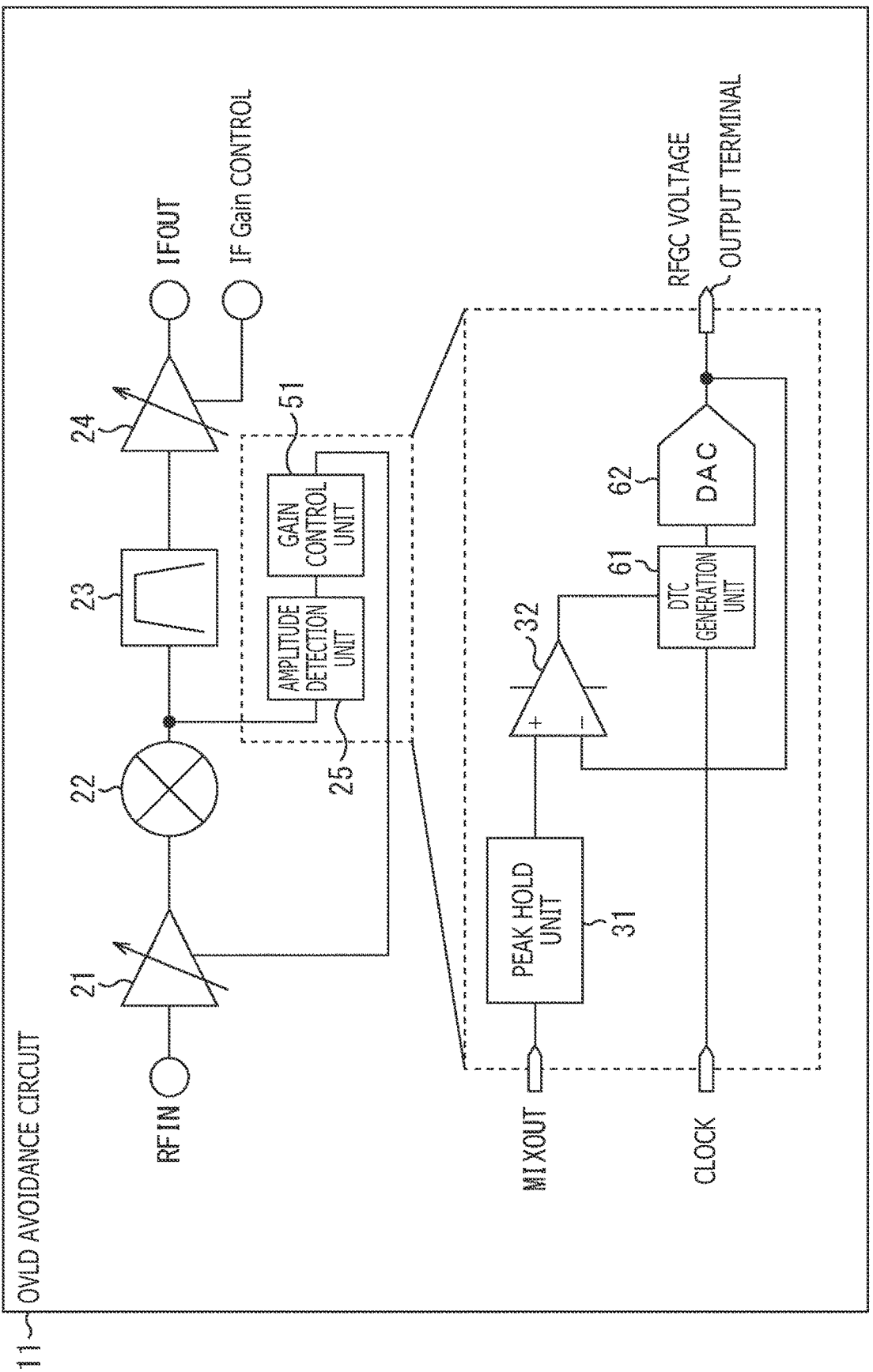
F I G . 6

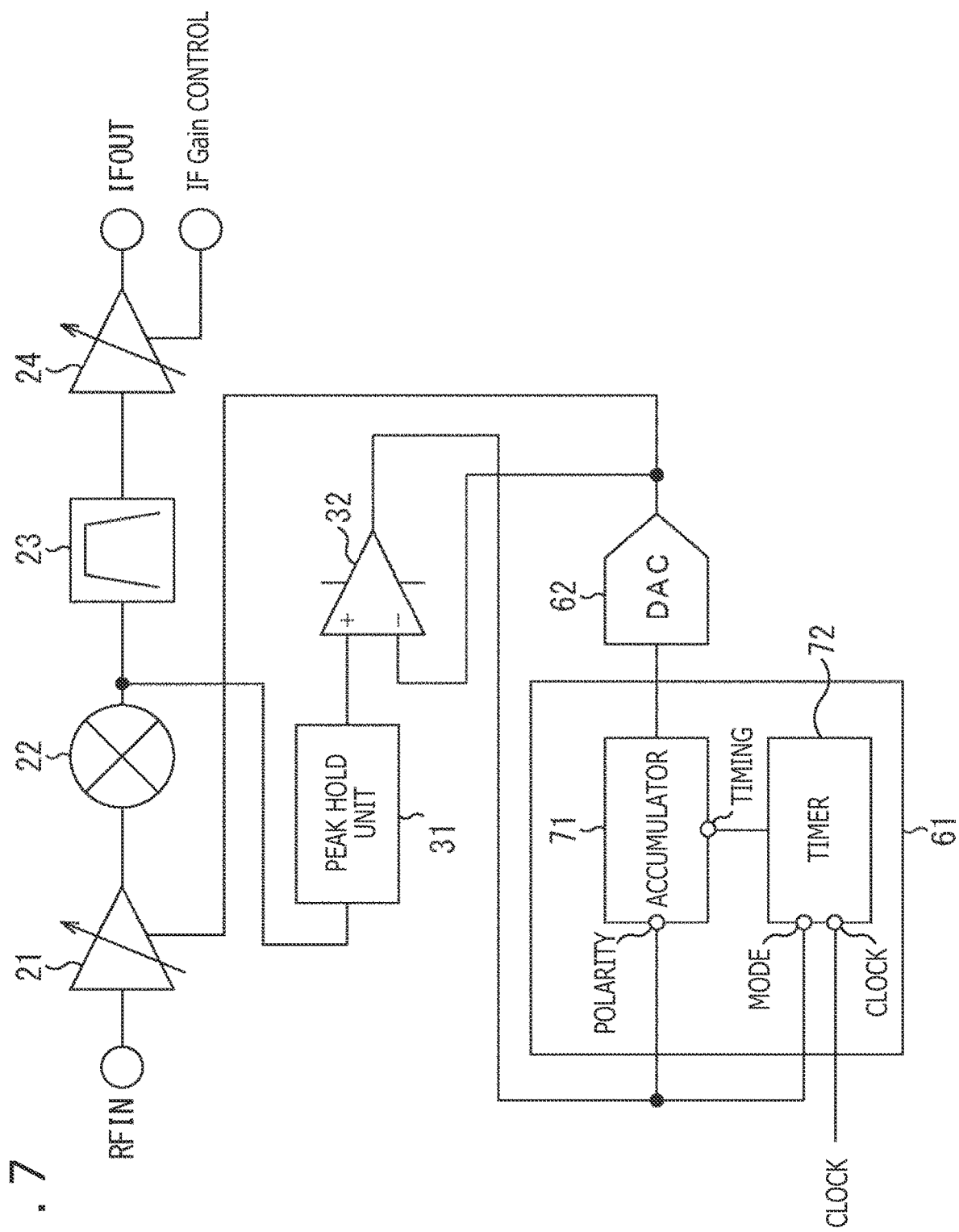
F I G. 7

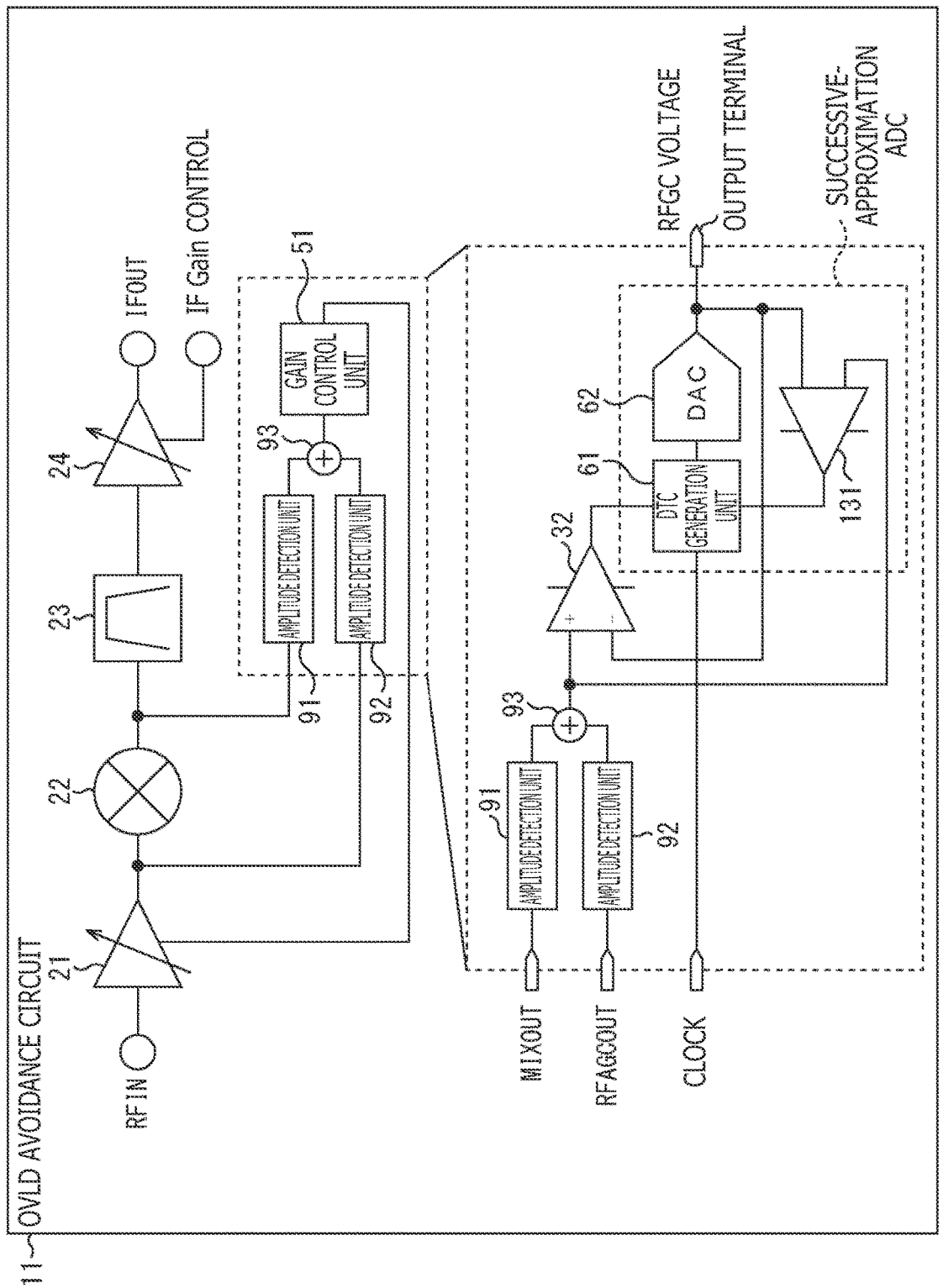
F I G . 1 6

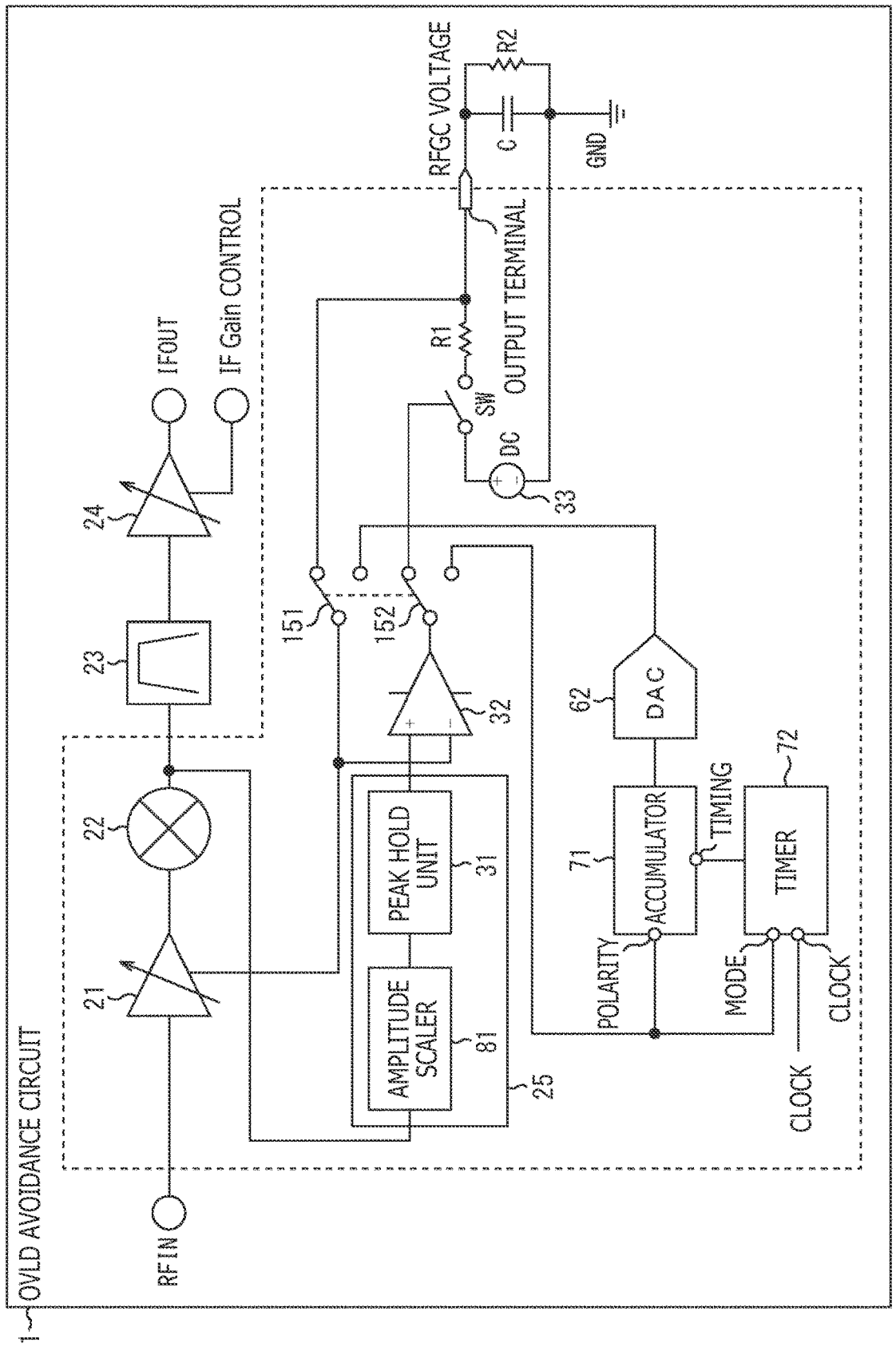

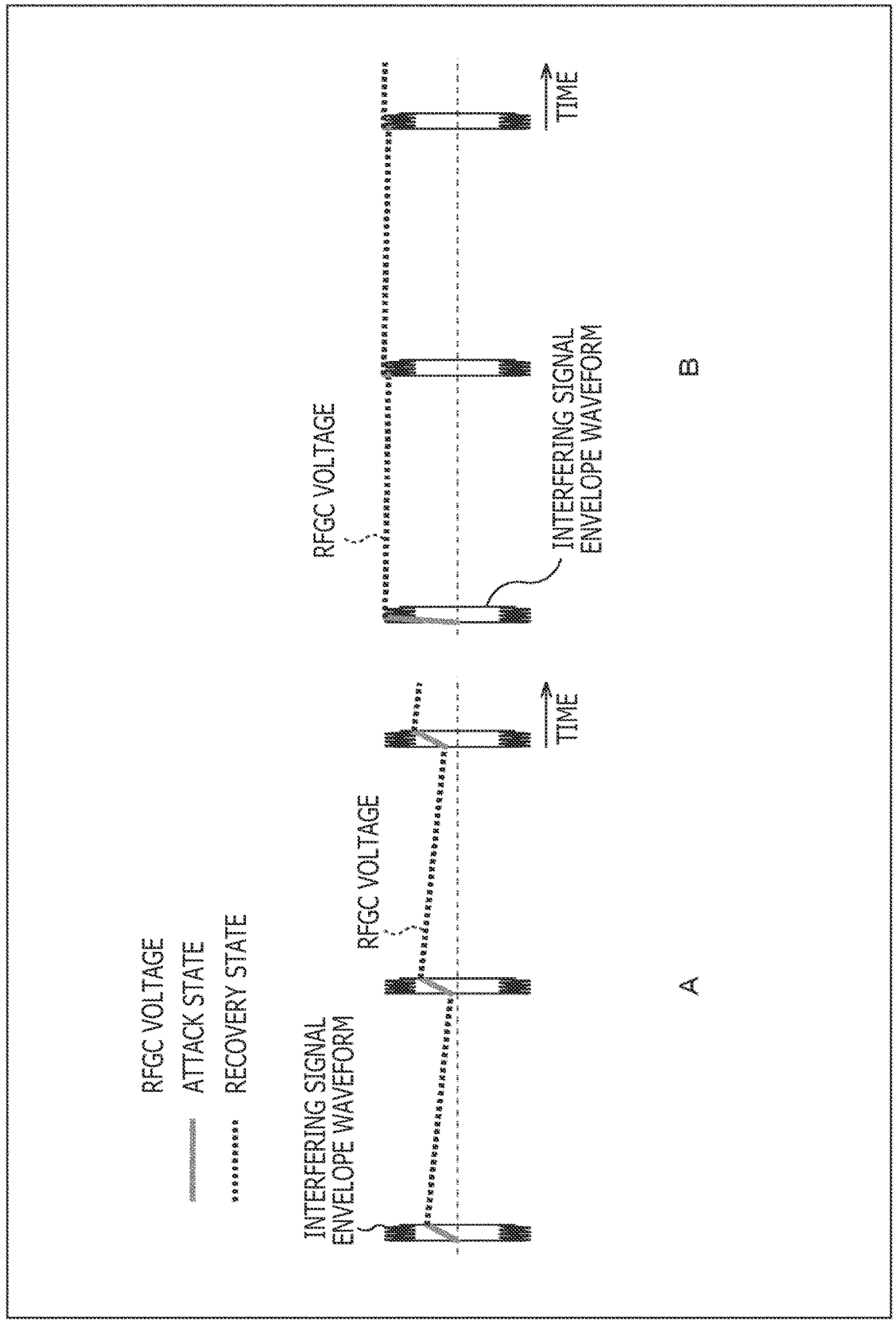

SIGNAL PROCESSING APPARATUS, SIGNAL PROCESSING METHOD, AND RECEIVING APPARATUS

TECHNICAL FIELD

The present technique pertains to a signal processing apparatus, a signal processing method, and a receiving apparatus, and in particular pertains to, for example, a signal processing apparatus, a signal processing method, and a receiving apparatus that enable gain control to be appropriately performed on various interfering signals.

BACKGROUND ART

A receiving apparatus that controls a gain of an amplifier configured to amplify an RF (radio frequency) signal and that prevents deterioration in communication quality has been proposed (for example, refer to PTL 1).

CITATION LIST

Patent Literature

[PTL 1]
Japanese Patent Laid-open No. 2018-157394

SUMMARY

Technical Problem

Incidentally, depending on (a profile for) an interfering signal, it is difficult to appropriately control the gain of an amplifier that amplifies an RF signal including the interfering signal, in some cases.

The present technique is made in the light of such a situation and enables gain control to be appropriately performed on various interfering signals.

Solution to Problem

A signal processing apparatus according to the present technique includes an amplifier that controls a gain according to a count value to amplify a signal, a comparator that compares the signal outputted by the amplifier with the count value, and an accumulator that counts the count value according to an output from the comparator.

A signal processing method according to the present technique includes controlling, by an amplifier, a gain according to a count value to amplify a signal, comparing, by a comparator, the signal outputted by the amplifier with the count value, and counting, by an accumulator, the count value according to an output from the comparator.

A receiving apparatus according to the present technique includes an amplifier that controls a gain according to a count value to amplify a signal, a comparator that compares the signal outputted by the amplifier with the count value, an accumulator that counts the count value according to an output from the comparator, and a demodulation circuit that demodulates the signal outputted by the amplifier.

In the signal processing apparatus, the signal processing method, and the receiving apparatus according to the present technique, the amplifier controls a gain according to a count value and amplifies a signal. The comparator compares the signal outputted by the amplifier with the count value, and the accumulator counts the count value according to an output from the comparator.

The signal processing apparatus and the receiving apparatus may be independent apparatuses or may be internal blocks included in one apparatus.

BRIEF DESCRIPTION OF DRAWINGS

FIG. 1 is a block diagram that illustrates an example of a configuration of one embodiment of a receiving apparatus to which the present technique has been applied.
FIG. 2 is a diagram that illustrates a first configuration example of an OVLD avoidance circuit 11.
FIG. 6 is a diagram that illustrates a second configuration example of the OVLD avoidance circuit 11.
FIG. 7 is a block diagram that illustrates a configuration example of a DTC generation unit 61.
FIG. 16 is a diagram that illustrates a seventh configuration example of the OVLD avoidance circuit 11,
FIG. 18 is a diagram that illustrates an eighth configuration example of the OVLD avoidance circuit 11.
FIG. 19 illustrates diagrams of an example of the RFGC voltage and the detection voltage that corresponds to the RF signal as an interfering signal.

DESCRIPTION OF EMBODIMENTS

Figure 3:
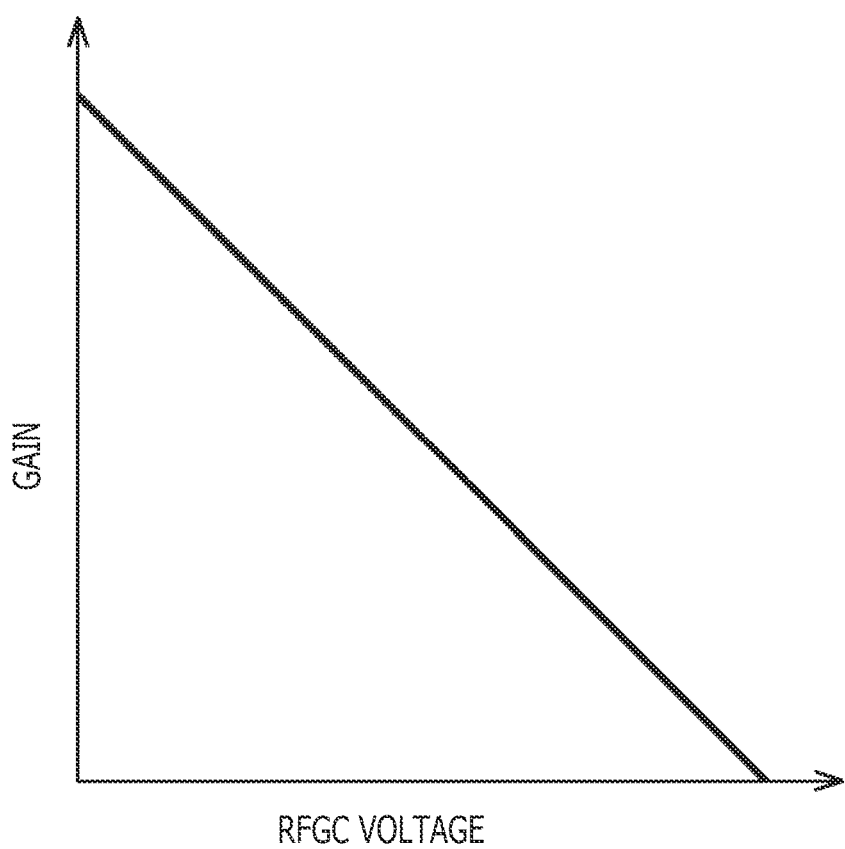
FIG. 3 is a diagram that illustrates an example of control of a gain of an RF amplifier 21.

<One Embodiment of Receiving Apparatus to which Present Technique has been Applied>

FIG. 1 is a block diagram that illustrates an example of a configuration of one embodiment of a receiving apparatus to which the present technique has been applied.

In FIG. 1, a receiving apparatus 10 has an OVLD (overload) avoidance circuit 11, and an ADC (analog to digital converter) 12, and a demodulation circuit 13.

The receiving apparatus 10 receives, for example, an RF signal for a television broadcast, etc., and demodulates and outputs the RF signal.

The RF signal is supplied to the OVLD avoidance circuit 11.

The OVID avoidance circuit 11 controls a gain such that the gain has such a level that can be processed by a subsequent block. Then, the OVLD avoidance circuit 11 amplifies the RF signal, performs a frequency conversion of the RF signal to an IF (intermediate frequency) signal, and outputs the IF signal.

The ADC 12 performs an AD conversion on the IF signal outputted by the OVLD avoidance circuit 11, and supplies the converted IF signal to the demodulation circuit 13.

The demodulation circuit 13 demodulates the IF signal supplied from the ADC 12 and outputs the demodulated signal.

<First Configuration Example of OVLD Avoidance Circuit 11>

FIG. 2 is a diagram that illustrates a first configuration example of the OVLD avoidance circuit 11 illustrated in FIG. 1.

In FIG. 2, the OVLD avoidance circuit 11 has an RF amplifier 21, a mixer 22, a BPF (band pass filter) 23, an IF amplifier 24, an amplitude detection unit 25, and a gain control unit 26.

An RF signal is supplied to the RF amplifier 21.

The RF amplifier 21 controls a gain according to an RFGC (RF gain control) voltage as a gain control signal (for the RF amplifier 21) that is outputted by the gain control unit 26. Then, the RF amplifier 21 amplifies the RF signal with the gain and outputs the RF signal. The RF amplifier 21 controls the gain according to the RFGC voltage, whereby the RF signal is amplified such that the receiving apparatus 10 can obtain an adaptively fine reception characteristic while avoiding saturation.

The mixer 22 multiplies the RF signal outputted by the RF amplifier 21, with a signal having a predetermined frequency, whereby the RF signal is frequency-converted to an IF signal and outputted.

Here, the IF signal outputted by the mixer 22 is a signal resulting from the frequency conversion of the RF signal outputted by the RF amplifier 21. Therefore, the IF signal outputted by the mixer 22 is also the signal outputted by the RF amplifier 21 and is proportional to the signal outputted by the RF amplifier 21.

The BPF 23 filters the IF signal outputted by the mixer 22 and outputs an IF signal having a predetermined frequency band.

The IF amplifier 24 amplifies the IF signal outputted by the BPF 23 and outputs the amplified IF signal. The IF signal outputted by the IF amplifier 24 is supplied to the ADC 12 (FIG. 1).

Here, a gain of the IF amplifier 24 is controlled according to a gain control signal (for the IF amplifier 24) supplied from a circuit not illustrated.

The amplitude detection unit 25 detects the amplitude (level) of the IF signal outputted by the mixer 22 (as described above, this IF signal is the signal outputted by the RF amplifier 21 and is proportional to the signal outputted by the RF amplifier 21) and outputs a detection voltage obtained as a result of the detection.

The amplitude detection unit 25 has a peak hold unit 31, for example.

The peak hold unit 31 holds a peak of the IF signal outputted by the mixer 22, to thereby detect an envelope of the IF signal, and outputs the level of the envelope as the detection voltage.

According to the detection voltage from the amplitude detection unit 25, the gain control unit 26 generates and outputs the RFGC voltage as a gain control signal. The RFGC voltage outputted by the gain control unit 26 is supplied to the RF amplifier 21, and the RF amplifier 21 controls a gain according to the RFGC voltage.

The gain control unit 26 has a comparator 32, a direct-current power supply 33, a switch SW, a resistor R1, a capacitor C, and a resistor R2, for example.

The detection voltage from the amplitude detection unit 25 (peak hold unit 31) is supplied to a non-inverting input terminal of the comparator 32. A voltage from the capacitor C which will be the RFGC voltage is supplied to an inverting input terminal of the comparator 32.

The comparator 32 compares the detection voltage supplied to the non-inverting input terminal, with the RFGC voltage supplied to the inverting input terminal, and outputs a result of the comparison.

For example, the comparator 32 outputs an H (high) level in a case where the detection voltage is (equal to or) greater than the RFGC voltage, and outputs an L (low) level in a case where the detection voltage is not greater than (i.e., is less than) the RFGC voltage.

Here, a state in which the detection voltage is greater than the RFGC voltage is also referred to as an attack state, and a state in which the detection voltage is not larger than the RFGC voltage is also referred to as a recovery state.

A positive electrode of the direct-current power supply 33 is connected to one end of the resistor R1 via the switch SW, and a negative electrode of the direct-current power supply 33 is connected to ground (GND).

The switch SW is turned on/off according to an output from the comparator 32, thereby connecting/disconnecting the direct-current power supply 33 to/from the resistor R1.

The other end of the resistor R1 is connected to one end of the capacitor C and one end of the resistor R2. The other ends of the capacitor C and the resistor R2 are connected to ground. Accordingly, the capacitor C and the resistor R2 are connected in parallel.

A connection point between the other end of the resistor R1 and the one ends of the capacitor C and the resistor R2 is connected to an output terminal, and a voltage at this connection point is outputted as the RFGC voltage by the output terminal of the gain control unit 26. Accordingly, the voltage of the capacitor C is outputted as the RFGC voltage by the output terminal.

In the gain control unit 26, for example, in a case where the output from the comparator 32 is at the H level and the attack state has been entered, the switch SW is turned on, and the connection between the direct-current power supply 33 and the resistor R1 is made. As a result, a (direct current) voltage is applied from the direct-current power supply 33 to the capacitor C, and the capacitor C is charged.

In contrast, in a case where the output from the comparator 32 is at the L level and the recovery state has been entered, the switch SW is turned off, and the connection between the direct-current power supply 33 and the resistor R1 is not made. As a result, the voltage is not applied from the direct-current power supply 33 to the capacitor C, and the electric charge that has been charged to the capacitor C is discharged via the resistor R2.

Accordingly, the application of the voltage from the direct-current power supply 33 to the capacitor C is on or off according to the output from the comparator 32.

FIG. 3 is a diagram that illustrates an example of control of a gain of the RF amplifier 21.

In FIG. 3, the horizontal axis represents the RFGC voltage, and the vertical axis represents the gain of the RF amplifier 21.

In the RF amplifier 21, as illustrated in FIG. 3, control is performed such that the gain decreases as the REGC voltage increases (and the gain increases as the RFGC voltage decreases).

Note that control (gain control) of the gain of the RF amplifier 21 can also be performed such that the gain increases as the REGC voltage increases. In a case of performing gain control of the RF amplifier 21 such that the gain increases as the RFGC voltage increases, it is necessary to invert the logic of the comparator 32.

In the OVLD avoidance circuit 11 in FIG. 2, in a case where the attack state, in which the detection voltage is greater than the RFGC voltage, is entered, the switch SW is turned on, and the capacitor C is charged. Accordingly, in the attack state, the voltage of the capacitor C, i.e., the RFGC voltage, rises, and the gain of the RF amplifier 21 decreases.

When the gain of the RF amplifier 21 decreases, the level (voltage) of the IF signal outputted by the mixer 22 and hence the detection voltage decrease.

When the detection voltage decreases and the recovery state, in which the detection voltage is not greater than the RFGC voltage, is entered, the switch SW is turned off, and the capacitor C is discharged. Accordingly, in the recovery state, the voltage of the capacitor C, i.e., the RFGC voltage, drops, and the gain of the RF amplifier 21 increases.

When the gain of the RF amplifier 21 rises, the level of the IF signal outputted by the mixer 22 and hence the detection voltage rise.

When the detection voltage and the RFGC voltage are in equilibrium, the OVLD avoidance circuit 11 stabilizes. In other words, the RFGC voltage and hence the gain of the RF amplifier 21 become (substantially) settled.

As described above, in the OVLD avoidance circuit 11, gain control of the RF amplifier 21 is performed when the capacitor C is charged and discharged by switching of the switch SW disposed on a charging path through which the direct-current power supply 33 charges the capacitor C, that is, a connection line between the direct-current power supply 33 and the capacitor C.

The method of gain control performed by using the switch SW to charge and discharge the capacitor C as described above is also referred to as an SW method below.

Figure 4:
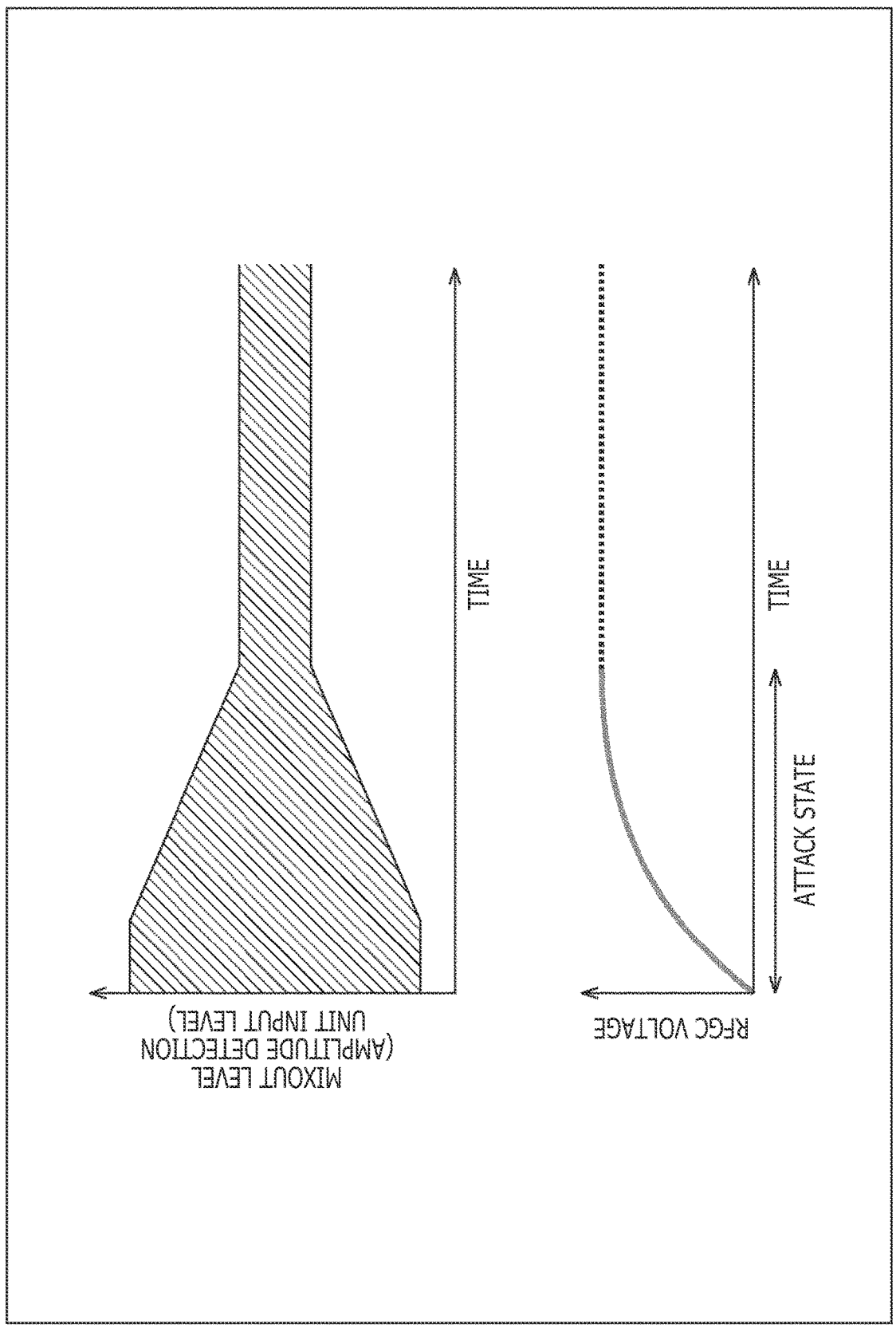
FIG. 4 is a diagram that illustrates an example of an RFGC voltage and a level (MIXOUT level) of an envelope of an IF signal at the time when the OVLD avoidance circuit 11 starts operating on the basis of the SW method.

FIG. 4 illustrates an example of the RFGC voltage and the level (MIXOUT level) of the envelope of the IF signal at the time when the OVLD avoidance circuit 11 starts operating on the basis of the SW method.

The OVLD avoidance circuit 11 is reset when the operation is started, and in response to the reset, the gain control unit 26 outputs the RFGC voltage of 0 V, for example. Note that, in addition to a timing of starting the operation, the OVLD avoidance circuit 11 is reset at a timing when the RFGC voltage returns to the original value (0 V here) after an interfering signal has arisen following the start of the operation and subsequently disappears, for example.

Thereafter, when an RF signal which corresponds to an interfering signal arises, this RF signal is amplified by the gain which is acquired immediately after the reset of the RF amplifier 21. As a result, the level of the IF signal (MIXOUT) outputted by the mixer 22 and hence the detection voltage increase.

In a case where the detection voltage is greater than the RFGC voltage (attack state), the switch SW is turned on, and the voltage of the capacitor C, which is the RFGC voltage, rises.

The RFGC voltage rises, whereby the gain of the RF amplifier 21 decreases. As a result, the level of the IF signal outputted by the mixer 22 and hence the detection voltage decrease.

When the detection voltage decreases and the recovery state, in which the detection voltage is not greater than the RFGC voltage, is entered, the switch SW is turned off, and the capacitor C is discharged. Accordingly, in the recovery state, the voltage of the capacitor C, i.e., the REGC voltage, drops, and the gain of the RF amplifier 21 increases.

When the gain of the RF amplifier 21 rises, the level of the IF signal outputted by the mixer 22 and hence the detection voltage rise.

Then, when the detection voltage and the REGC voltage are in equilibrium, the OVLD avoidance circuit 11 stabilizes. In other words, the RFGC voltage and hence the gain of the RF amplifier 21 become (substantially) settled.

Figure 5:
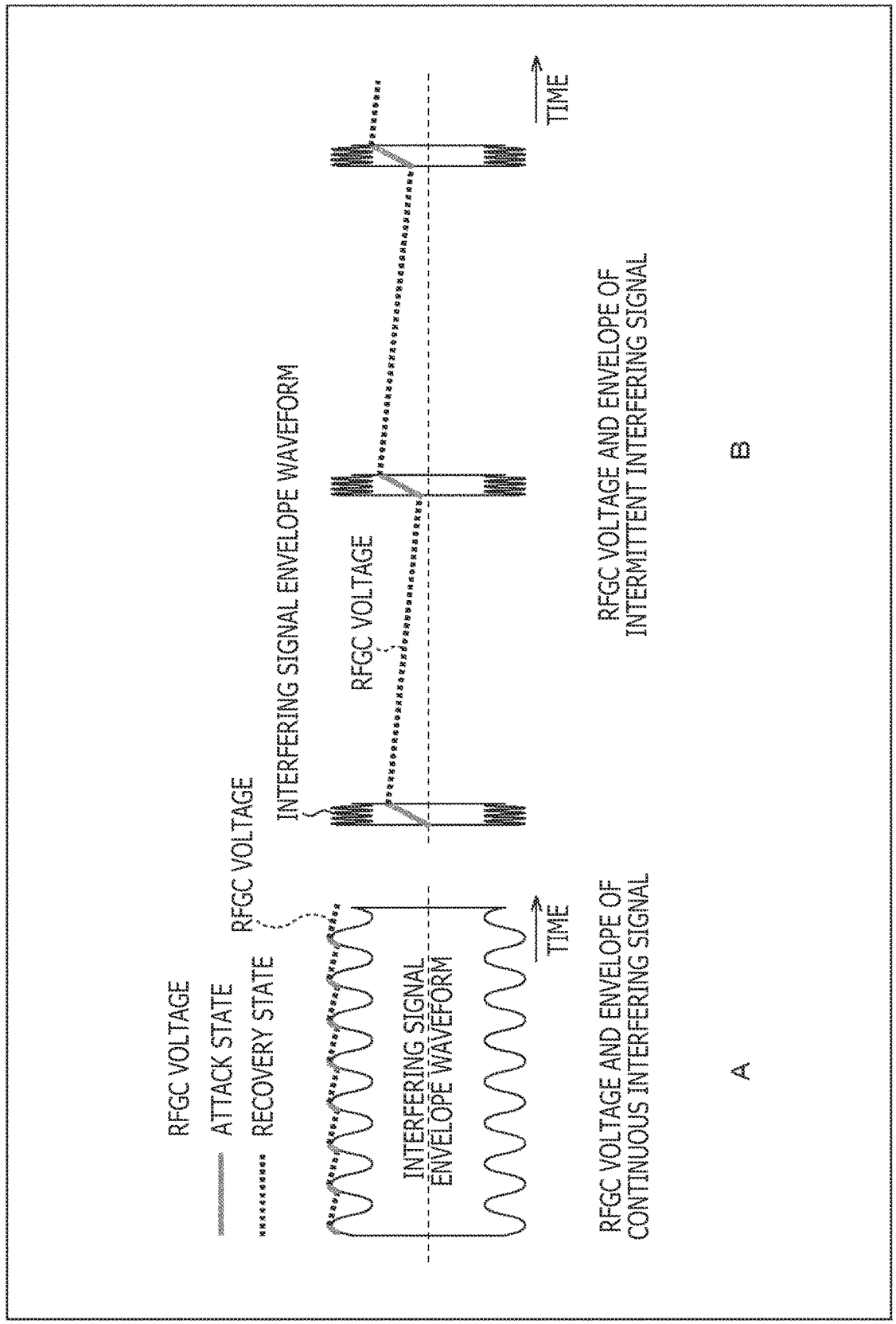
FIG. 5 illustrates diagrams of an example of the RFGC voltage and a detection voltage that corresponds to an RF signal as an interfering signal.

FIG. 5 illustrates an example of the RFGC voltage and a detection voltage that corresponds to the RF signal as an interfering signal.

A of FIG. 5 illustrates the RFGC voltage and a detection voltage that corresponds to a continuous interfering signal.

Regarding the continuous interfering signal, the attack state and the recovery state are repeated with a short period, and an RFGC voltage substantially in a stable state, i.e., an RFGC voltage having little fluctuations, is generated.

B of FIG. 5 illustrates the RFGC voltage and a detection voltage that corresponds to an intermittent interfering signal.

Regarding the intermittent interfering signal, the attack state is entered in a period of time in which the interfering signal is present, and the recovery state is entered in a period of time in which the interfering signal is absent.

Accordingly, regarding the intermittent interfering signal, the attack state and the recovery state are repeated according to the length of the period of time in which the interfering signal is present or absent.

Further, the voltage of the capacitor C, which is the RFGC voltage, rises in the attack state, and the voltage of the capacitor C, which is the RFGC voltage, decreases in the recovery state according to a time constant determined by the capacitor C and the resistor R2.

Accordingly, the RFGC voltage takes on a serrated waveform.

Here, the time required for the RFGC voltage to start stabilizing after an RF signal corresponding to an interfering signal is received in the OVLD avoidance circuit 11 is referred to as attack time.

In addition, the time required for the RFGC voltage to return to the voltage at the time of the reset after the RF signal corresponding to an interfering signal is received in the OVLD avoidance circuit 11 and the interfering signal then disappears is referred to as recovery time.

In both A and B of FIG. 5, the RFGC voltage has not stabilized, and thus, the RFGC voltage is in a state during the attack time.

From a perspective of stabilizing the RFGC voltage quickly, the attack time is preferably short. To shorten the attack time, it is necessary to reduce the time constant at the time of charging and discharging the capacitor C.

In addition, from a perspective of stabilizing the RFGC voltage over a long period of time, it is desirable for the recovery time to be long. To lengthen the recovery time, it is necessary to increase the time constant at the time of discharging the capacitor C.

If the recovery time is short, for the intermittent interfering signal, the drop amount of the RFGC voltage increases during a period of time in which the interfering signal is not present, and the change of the serrated RFGC voltage increases. Thus, it becomes difficult to generate a stable RFGC voltage.

Regarding the intermittent interfering signal, in order to generate a stable RFGC voltage, it is necessary to shorten the attack time while lengthening the recovery time.

However, in the OVLD avoidance circuit 11 using the SW method, the attack time and the recovery time are constrained due to the circuit configuration, and it is difficult to generate a stable RFGC voltage for an intermittent interfering signal.

In other words, in the OVLD avoidance circuit 11 using the SW method, the attack time and the recovery time are determined according to a time constant which is determined by a product of a capacitance and a resistance, but a circuit constant that can be applied to a time constant circuit that imparts the time constant is constrained.

The capacitance of a capacitor that can be obtained as a general-purpose chip component is approximately 0.1 uF at a maximum. Since a capacitor that exceeds this value is expensive, has high temperature and voltage dependence on the capacitance, or has a large size, for example, it is difficult to employ such a capacitor for consumer usage.

In addition, although it is possible to lengthen the recovery time by increasing the capacitance of the capacitor C, the attack time is also lengthened at the same time.

Accordingly, as the capacitance of the capacitor C, a value that strikes a balance between shortening the attack time and lengthening the recovery time is employed.

As a method of lengthening the recovery time, there is a method of increasing the resistance of the resistor R2 in addition to a method of increasing the capacitance of the capacitor C.

However, in the OVLD avoidance circuit 11, various leaks are present in such devices as a substrate, components, and ICs. Therefore, a resistance that can be employed for the resistor R2 is approximately 10 MΩ at a maximum, and the recovery time is constrained by this resistance.

As described above, in the OVLD avoidance circuit 11 using the SW method, in order to lengthen the recovery time, it is necessary to use a capacitor having a large capacitance as the capacitor C, and thus, a BOM (bill of material) cost increases. Further, it is difficult to provide a capacitor C having a large capacitance within a chip, and the substrate surface area increases because it is necessary to externally attach the capacitor C. In addition, in a case of providing a resistor R2 having a large resistance of approximately 10 MΩ in order to lengthen the recovery time as described above, it is also necessary to externally attach the resistor R2 similarly to the capacitor C having a large capacitance, and the substrate surface area also increases.

In addition, in the OVLD avoidance circuit 11 using the SW method, in a case of the intermittent interfering signal in particular, the attack time lengthens due to the time constant.

Further, in the OVID avoidance circuit 11 using the SW method, the length of the recovery time is constrained due to the capacitance of the capacitor C, a component unit price, or a leak from a device. Due to this constraint, there is an intermittent interfering signal (profile) for which it is difficult to generate a stable RFGC voltage.

In addition, in an OVLD avoidance circuit 11 using the SW method, variation arises in the operation due to a deviation of the capacitance of the capacitor C, temperature dependence, or voltage dependence, in some cases.

<Second Configuration Example of OVLD Avoidance Circuit 11>

FIG. 6 is a diagram that illustrates a second configuration example of the OVLD avoidance circuit 11 illustrated in FIG. 1.

Note that, in FIG. 6, constituent elements corresponding to those in FIG. 2 are denoted by the same reference signs, and description thereof is omitted below as appropriate.

In FIG. 6, the OVLD avoidance circuit 11 has an RF amplifier 21, a mixer 22, a BPF 23, an IF amplifier 24, an amplitude detection unit 25, and a gain control unit 51.

Accordingly, the OVLD avoidance circuit 11 in FIG. 6 has the RF amplifier 21 through the amplitude detection unit 25 as with the OVLD avoidance circuit 11 in FIG. 2.

However, the OVLD avoidance circuit 11 in FIG. 6 differs from that in FIG. 2 in having the gain control unit 51 in place of the gain control unit 26.

According to the detection voltage from the amplitude detection unit 25, the gain control unit 51 generates and outputs the RFGC voltage as a gain control signal. The RFGC voltage outputted by the gain control unit 51 is supplied to the RF amplifier 21, and the RE amplifier 21 controls a gain according to the REGC voltage.

The gain control unit 51 has a comparator 32, a DTC (digital time constant) generation unit 61, and a DAC (digital to analog converter) 62.

According to an output from the comparator 32, the DTC generation unit 61 performs counting in synchronization with a clock supplied from an external unit, and a count value that changes according to a predetermined time constant is generated on the basis of the counting and is then outputted.

The DAC 62 performs a DA conversion to convert the count value outputted by the DTC generation unit 61 to an analog signal, and outputs the analog signal as an REGC voltage.

The RFGC voltage outputted by the DAC 62 is supplied to the RF amplifier 21 via an output terminal (of the gain control unit 51) and is also supplied to the inverting input terminal of the comparator 32.

Accordingly, the comparator 32 compares the detection voltage outputted by the amplitude detection unit 25 (peak hold unit 31), with the RFGC voltage outputted by the DAC 62.

Note that, in a case where gain control of the RF amplifier 21 can be performed by using a digital signal, the gain control unit 51 can be configured without the DAC 62. In this case, the count value outputted by the DTC generation unit 61 can be supplied to the RF amplifier 21 as a gain control signal.

In addition, in FIG. 6, the REGC voltage is a signal (voltage) resulting from the conversion of the count value outputted by the DTC generation unit 61 to an analog signal. Accordingly, the RF amplifier 21, which performs gain control according to the RFGC voltage, can be referred to as an amplifier that performs gain control according to the count value outputted by the DTC generation unit 61.

Similarly, the comparator 32 can be referred to as a comparator that compares the signal outputted by the RF amplifier 21 with the count value outputted by the DTC generation unit 61.

FIG. 7 is a block diagram that illustrates a configuration example of the DTC generation unit 61 illustrated in FIG. 6.

The DTC generation unit 61 has an accumulator 71 and a timer 72.

The accumulator 71 counts the count value according to an output from the comparator 32.

In other words, the accumulator 71 counts (accumulates) the count value with an accumulation polarity which corresponds to the output from the comparator 32, at a timing of a timing signal outputted by the timer 72.

The accumulator 71 performs one of incrementing and decrementing of the count value in an attack state in which the output from the comparator 32 is at the H level. In addition, the accumulator 71 performs the other of incrementing or decrementing of the count value in a recovery state in which the output from the comparator 32 is at the L level.

For example, the accumulator 71 counts (increments) the count value with the accumulation polarity for incrementing in the attack state, and counts (decrements) the count value with the accumulation polarity for decrementing in the recovery state.

The timer 72 generates and outputs a timing signal (for example, a pulse) which is synchronized with the clock supplied to the DTC generation unit 61.

According to an output from the comparator 32, the timer 72 sets a timer mode which is an operation mode of the timer 72, and generates a timing signal having an interval (period) that differs depending on the timer mode.

Here, a timer mode for the attack state in which the output from the comparator 32 is at the H level is also referred to as an attack mode, and a timer mode for the recovery state in which the output from the comparator 32 is at the L level is also referred to as a recovery mode.

In the attack mode, the timer 72 generates a timing signal having a period (a first interval) obtained by dividing the clock by N. In the recovery mode, the timer 72 generates a timing signal having a period (a second interval) obtained by dividing the clock by M which is greater than N.

Accordingly, the period of the timing signal in the recovery mode is longer than the period of the timing signal in the attack mode.

Here, the period of the timing signal in the attack mode is also referred to as an attack period, and the period of the timing signal in the recovery mode is also referred to as a recovery period.

The timer 72 is configured such that the attack period and the recovery period (division ratios N and M) can be set from an external unit.

Accordingly, the attack period and the recovery period are programmable.

The accumulator 71 counts the count value at the timing of the timing signal outputted by the timer 72, that is, at the attack period or the recovery period. Accordingly, the count interval of the count value from the accumulator 71 is also programmable.

In the OVLD avoidance circuit 11 configured as described above, in a case where the attack state in which the detection voltage is greater than the RFGC voltage has been entered (in a case where the output from the comparator 32 is at the H level), the timer 72 enters the attack mode and generates and outputs a timing signal having the attack period.

In the attack state, the accumulator 71 increments the count value one digit at a time, for example, at the timing of the timing signal outputted by the timer 72. The DAC 62 performs a DA conversion on the count value from the accumulator 71, and outputs the converted count value as the RFGC voltage.

Accordingly, in the attack state, the REGC voltage rises each time there is a voltage corresponding to one digit of the count value, at the attack period.

As the RFGC voltage rises, the gain of the RF amplifier 21 decreases.

When the gain of the RF amplifier 21 decreases, the level of the IF signal outputted by the mixer 22 and hence the detection voltage decrease.

When the detection voltage decreases and the recovery state, in which the detection voltage is not greater than the RFGC voltage, is entered (when the output from the comparator 32 becomes the L level), the timer 72 enters the recovery mode and generates and outputs a timing signal having the recovery period.

In the recovery state, the accumulator 71 decrements the count value one digit at a time, for example, at the timing of the timing signal outputted by the timer 72. The DAC 62 performs a DA conversion on the count value from the accumulator 71, and outputs the converted count value as the RFGC voltage.

Accordingly, in the recovery state, the RFGC voltage drops each time there is a voltage corresponding to one digit of the count value, at the recovery period.

As the RFGC voltage drops, the gain of the RF amplifier 21 increases.

When the gain of the RF amplifier 21 rises, the level of the IF signal outputted by the mixer 22 and hence the detection voltage rise.

In the above manner, in the OVLD avoidance circuit 11, while saturation of the IF signal outputted by the mixer 22 is avoided, the detection voltage and the RFGC voltage balance out such that the IF signal is kept to a level at which a preferable reception state can be achieved.

When the detection voltage and the RFGC voltage are in equilibrium, the OVLD avoidance circuit 11 stabilizes. In other words, the RFGC voltage and hence the gain of the RF amplifier 21 become (substantially) settled.

As described above, in the OVLD avoidance circuit 11, gain control of the RF amplifier 21 is performed when the count value is incremented at the attack period and decremented at the recovery period.

Figure 8:
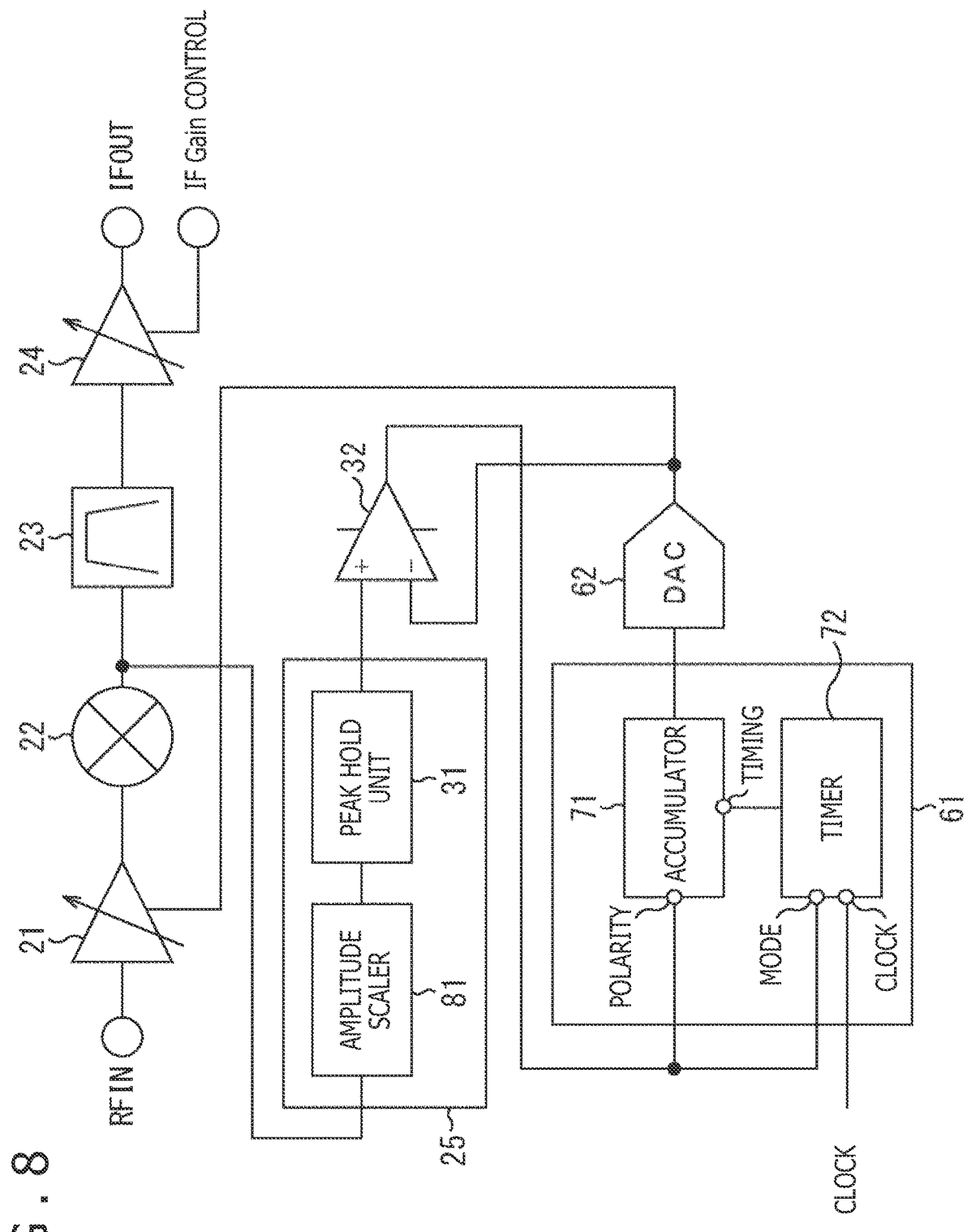
FIG. 8 is a block diagram that illustrates another configuration example of an amplitude detection unit 25.

The method of gain control performed by incrementing of the count value at the attack period and decrementing of the count value at the recovery period as described above may hereinafter be referred to as a count method, FIG. 8 is a block diagram that illustrates another configuration example of the amplitude detection unit 25. Note that, in FIG. 8, constituent elements corresponding to those in FIG. 2 or FIG. 6 are denoted by the same reference signs, and description thereof is omitted below as appropriate.

In FIG. 8, the amplitude detection unit 25 has a peak hold unit 31 and an amplitude scaler 81.

Accordingly, the amplitude detection unit 25 in FIG. 8 has the peak hold unit 31 as with the amplitude detection unit 25 in FIG. 2 or FIG. 6. However, the amplitude detection unit 25 in FIG. 8 differs from that in FIG. 2 or FIG. 6 in that the amplitude scaler 81 is additionally provided.

The IF signal outputted by the mixer 22 is supplied to the amplitude scaler 81.

The amplitude scaler 81 scales the IF signal outputted by the mixer 22, that is, multiplies the IF signal by a predetermined amplitude scaler coefficient, and supplies a result to the peak hold unit 31.

Accordingly, the peak hold unit 31 in FIG. 8 detects an envelope of the IF signal that has been subjected to the scaling and supplied from the amplitude scaler 81, and outputs the level of the envelope as the detection voltage. Then, the comparator 32 compares the detection voltage of the IF signal that has been subjected to the scaling (signal outputted by the amplitude scaler 81), with the RFGC voltage (output from the DAC 62).

Note that the amplitude scaler coefficient used in the amplitude scaler 81 can be set from an external unit, and is programmable.

Figure 9:
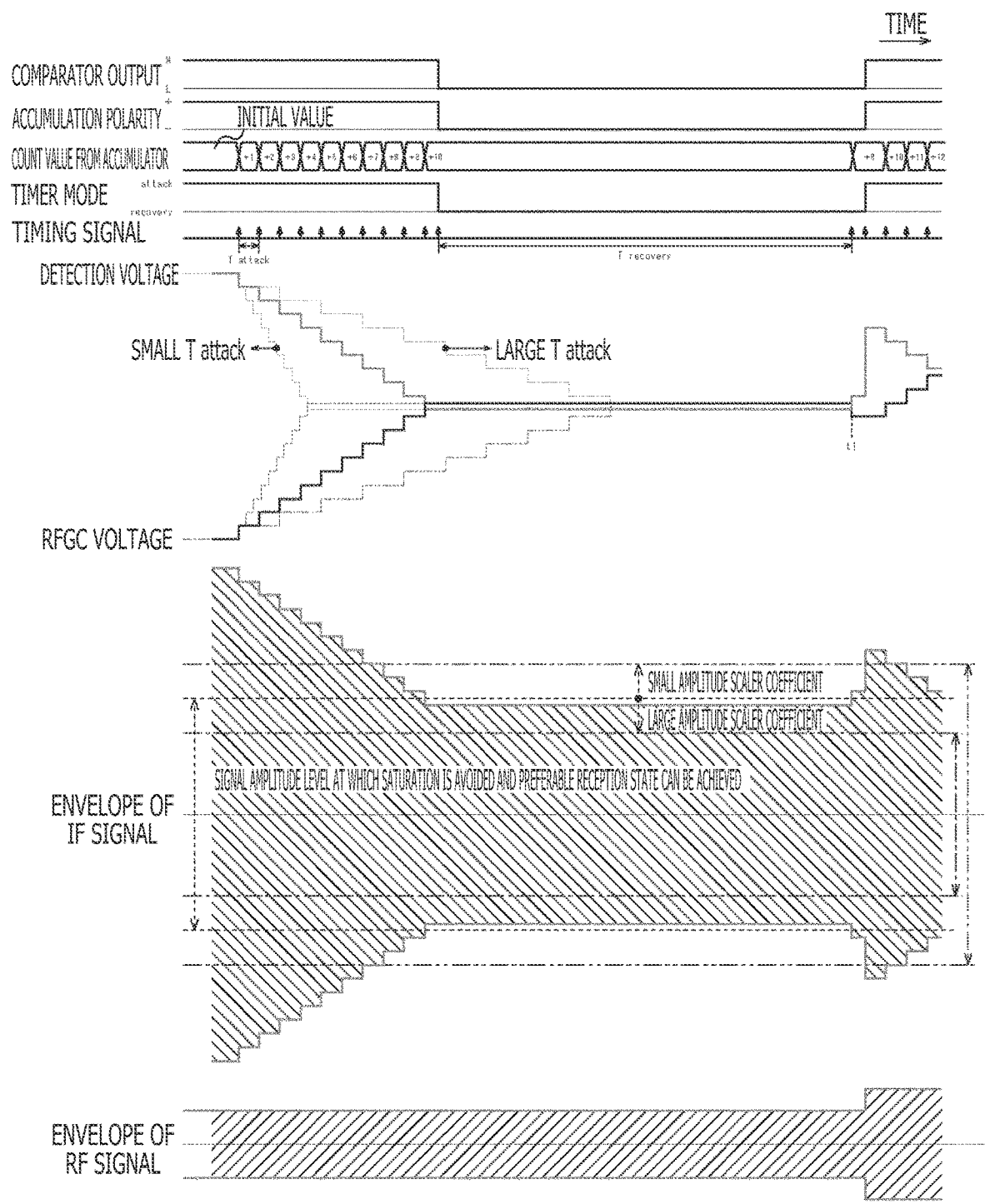
FIG. 9 is a timing chart for describing an example of operation performed by the OVLD avoidance circuit 11.

FIG. 9 is a timing chart for describing an example of operation performed by the OVLD avoidance circuit 11 illustrated in FIG. 6.

FIG. 9 illustrates, in order from the top, the output from the comparator 32 (comparator output), the accumulation polarity of the accumulator 71, the count value from the accumulator 71, the timer mode of the timer 72, the timing signal outputted by the timer 72, the detection voltage outputted by the amplitude detection unit 25, the RFGC voltage outputted by the DAC 62, the envelope of the IF signal outputted by the mixer 22, and the envelope of the RF signal outputted by the RF amplifier 21.

The OVLD avoidance circuit 11 is reset when the operation starts, and after the reset, a predetermined initial value is set as a count value in the accumulator 71. The initial value for the count value can be set from an external unit.

The DAC 62 performs a DA conversion on the initial value for the count value, and outputs the converted value as the RFGC voltage.

Meanwhile, at the RF amplifier 21, for example, an RF signal that includes an interfering signal is amplified by a gain that corresponds to the RFGC voltage, and is outputted to the mixer 22. The mixer 22 converts the RF signal from the RF amplifier 21 to an IF signal, and outputs the IF signal.

In the amplitude detection unit 25, the IF signal outputted by the mixer 22 is scaled, and the envelope of the scaled IF signal is detected, whereby the level of the envelope of the IF signal is outputted as the detection voltage.

In a case where the attack state in which the detection voltage is greater than the RFGC voltage has been entered, that is, in a case where the output from the comparator 32 is at the H level, the timer 72 sets the timer mode to the attack mode, and generates and outputs a timing signal having an attack period Tattack.

In the attack state, the accumulator 71 sets the accumulation polarity to an increment (+) and counts the count value at a timing of the timing signal outputted by the timer 72. Accordingly, the count value is incremented one-by-one at the attack period Tattack.

The DAC 62 performs a DA conversion on the count value from the accumulator 71 and outputs the converted count value as the RFGC voltage.

Accordingly, in the attack state, the REGC voltage rises each time there is a voltage corresponding to one digit of the count value, at the attack period Tattack.

As the RFGC voltage rises, the gain of the RF amplifier 21 decreases.

When the gain of the RF amplifier 21 decreases, the level of the IF signal outputted by the mixer 22 decreases, and the detection voltage outputted by the peak hold unit 31 also decreases.

When the detection voltage decreases and the recovery state in which the detection voltage is not greater than the RFGC voltage has been entered, the timer 72 set the timer mode to the recovery mode, and generates and outputs a timing signal having a recovery period Trecovery.

In the recovery state, the accumulator 71 sets the accumulation polarity to a decrement (−) and counts the count value at a timing of the timing signal outputted by the timer 72. Accordingly, the count value is decremented one-by-one at the recovery period Trecovery.

The DAC 62 performs a DA conversion on the count value from the accumulator 71 and outputs the converted count value as the RFGC voltage.

Accordingly, in the recovery state, the RFGC voltage drops each time there is a voltage corresponding to one digit of the count value (hereinafter referred to as a unit voltage), at the recovery period Trecovery.

As the RFGC voltage drops, the gain of the RF amplifier 21 increases.

When the gain of the RF amplifier 21 increases, the level of the IF signal outputted by the mixer 22 rises, and thus, the detection voltage rises.

In FIG. 9, at a time t1 in the recovery state, the RFGC voltage drops by only a unit voltage, whereby the attack state in which the detection voltage is greater than the RFGC voltage is entered. Immediately after the attack state is entered, the RF signal increases. Accordingly, the detection voltage further rises in response to the RF signal.

Thereafter, in the OVLD avoidance circuit 11, a similar operation is repeated, and the detection voltage and the RFGC voltage balance out.

When the detection voltage and the RFGC voltage balance out, the RFGC voltage and hence the gain of the RF amplifier 21 become settled, and the OVLD avoidance circuit 11 stabilizes.

The inclination of the increment of the count value in the attack state and hence the inclination (V/sec) of the rise in the RFGC voltage can be adjusted according to the attack period Tattack. In other words, as illustrated in FIG. 9, by setting a short (small) attack period Tattack, it is possible to make the inclination of the rise in the RFGC voltage be steep, and by setting a long (large) attack period Tattack, it is possible to make the inclination of the rise in the RFGC voltage be gradual.

Similarly, the inclination of the decrement of the count value in the recovery state and hence the inclination of the drop in the RFGC voltage can be adjusted according to the recovery period Trecovery. In other words, by setting a short recovery period Trecovery, it is possible to make the inclination of the drop in the RFGC voltage be steep, and by setting a long recovery period Trecovery, it is possible to make the inclination of the drop in the REGC voltage be gradual.

Accordingly, by setting a short attack period Tattack, it is possible to make the inclination of the rise in the RFGC voltage be steep and shorten a convergence time required for the RFGC voltage (and the IF signal) to converge.

In addition, by setting a longer recovery period Trecovery than the attack period Tattack, it is possible to make the inclination of the drop in the RFGC voltage be gradual and lengthens a duration of a converged state of the RFGC voltage.

By shortening the convergence time for the RFGC voltage and lengthening the duration of the converged RFGC voltage, it is possible to shorten the attack time while lengthening the recovery time.

Accordingly, by virtue of the count method, it is possible to achieve a short attack time and a long recovery time without constraining component constants for the externally attached capacitor C and resistor R2 or constraining a characteristic of an actual device such as a leak, as with the SW method. As a result, gain control is appropriately performed on various interfering signals.

Note that, in a case where the amplitude detection unit 25 includes the amplitude scaler 81 as illustrated in FIG. 8 and adjusts the amplitude scaler coefficient, the level of the IF signal at the time when the RFGC voltage (and the IF signal) converges can be adjusted to an appropriate level for the receiving apparatus 10.

<Third Configuration Example of OVLD Avoidance Circuit 11>

Figure 10:
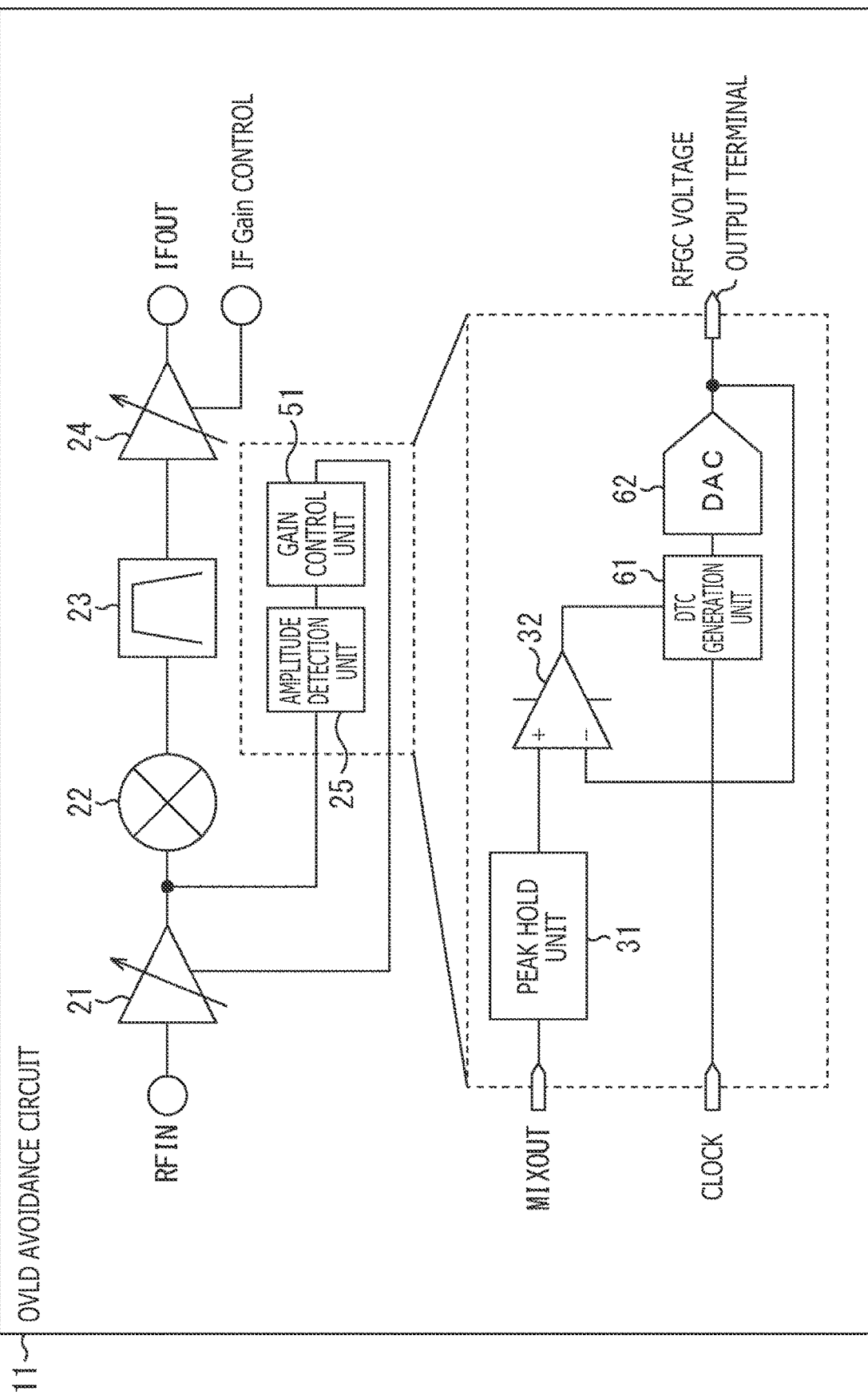
FIG. 10 is a diagram that illustrates a third configuration example of the OVLD avoidance circuit 11.

FIG. 10 is a diagram that illustrates a third configuration example of the OVLD avoidance circuit 11 illustrated in FIG. 1.

Note that, in FIG. 10, constituent elements corresponding to those in FIG. 6 are denoted by the same reference signs, and description thereof is omitted below as appropriate.

In FIG. 10, the OVLD avoidance circuit 11 has an RF amplifier 21, a mixer 22, a BPF 23, an IF amplifier 24, an amplitude detection unit 25, and a gain control unit 51.

Accordingly, the OVLD avoidance circuit 11 in FIG. 10 is configured similarly to that in FIG. 6.

However, the OVLD avoidance circuit 11 in FIG. 10 differs from that in FIG. 6 in the following configuration. Specifically, the OVLD avoidance circuit 11 in FIG. 10 is configured such that the RF signal which has just been outputted by the RF amplifier 21 is supplied to the amplitude detection unit 25, while the OVLD avoidance circuit 11 in FIG. 6 is configured such that the IF signal which has just been outputted by the mixer 22 is supplied to the amplitude detection unit 25.

Accordingly, in the OVLD avoidance circuit 11 in FIG. 10, the amplitude detection unit 25 detects the envelope of the RF signal which has just been outputted by the RF amplifier 21, instead of detecting the envelope of the IF signal which has just been outputted by the mixer 22. Then, the amplitude detection unit 25 supplies the level of the envelope of the RF signal to the gain control unit 51 as the detection voltage.

In the OVLD avoidance circuit 11 in FIG. 6, gain control of the RF amplifier 21 is performed according to a result of the comparison between the RFGC voltage and the detection voltage which is obtained by detecting the envelope of the IF signal outputted by the mixer 22.

In contrast, in the OVLD avoidance circuit 11 in FIG. 10, gain control of the RF amplifier 21 is performed according to a result of the comparison between the RFGC voltage and the detection voltage which is obtained by detecting the envelope of the RF signal outputted by the RF amplifier 21.

In some cases, band limiting using a LPF (low pass filter) is applied to the IF signal outputted by the mixer 22.

In a case where band limiting is applied to the IF signal, an interfering signal for which a detection voltage is detected is only an interfering signal (nearby interfering signal) within a predetermined frequency band centered on a desired signal that the receiving apparatus 10 is attempting to receive.

Accordingly, an interfering signal distantly separated from the desired signal on the frequency axis (a distant interfering signal), that is, a distant interfering signal outside of the range of a predetermined frequency band centered on the desired signal, is not to be detected.

Accordingly, there are cases where it is possible to reduce reception failure caused by a distant interfering signal.

Figure 11:
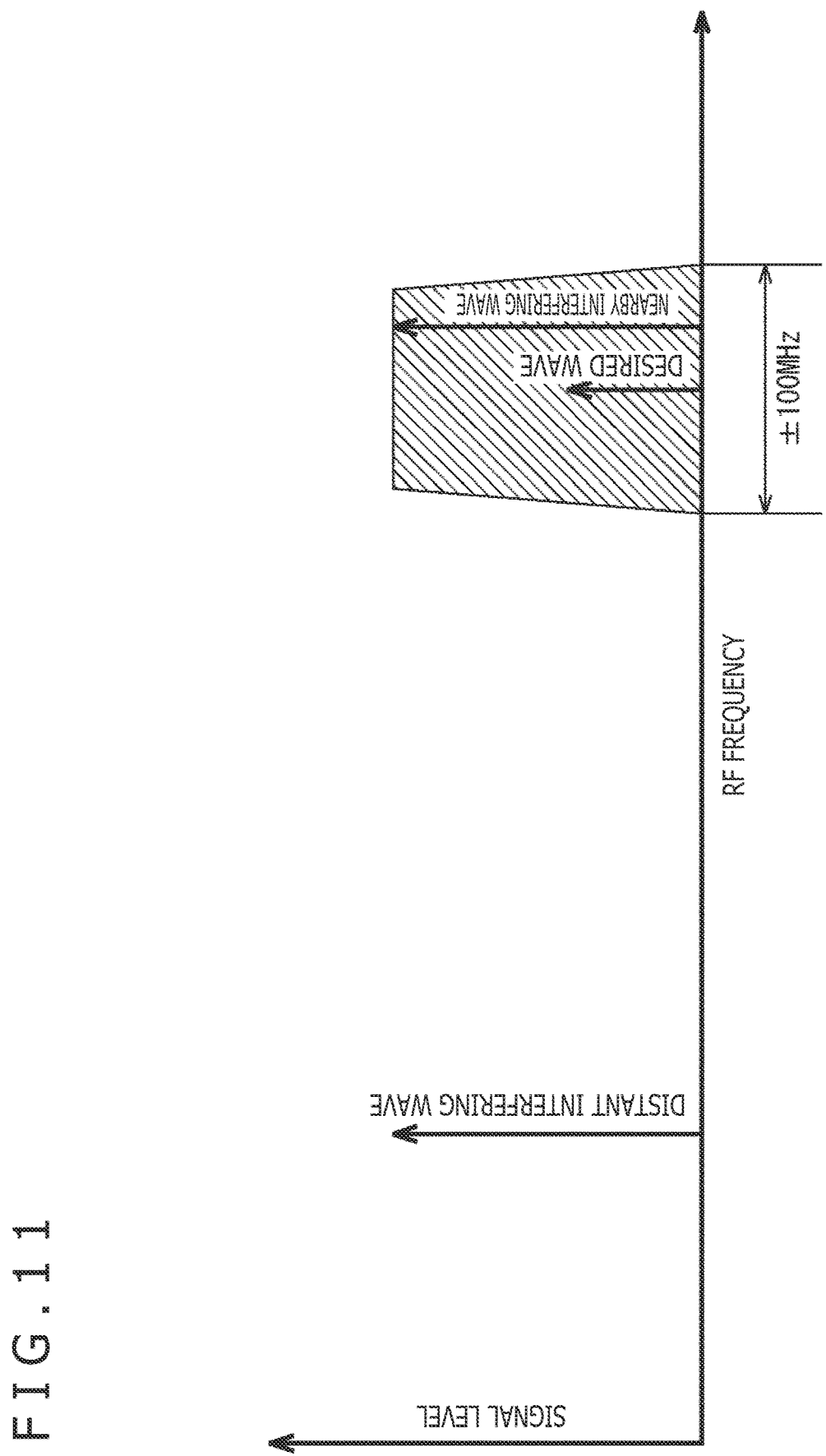
FIG. 11 is a diagram that illustrates an example of a frequency distribution of a desired signal and interfering signals.

FIG. 11 illustrates an example of a frequency distribution of a desired signal and interfering signals.

In a case where band limiting is applied to the IF signal outputted by the mixer 22, an interfering signal for which a detection voltage is detected is only a nearby interfering signal (nearby interfering wave) within a predetermined frequency band of approximately +100 MHz, for example, centered on a desired signal (desired wave) that the receiving apparatus 10 is attempting to receive.

Accordingly, a distant interfering signal (distant interfering wave) outside of the range of the frequency band of approximately #100 MHz centered on the desired signal is not to be detected.

Accordingly, although (the envelope of) the IF signal outputted by the mixer 22 is detected, a distant interfering signal is not reflected in the detection voltage, and reception failure caused by the distant interfering signal cannot be reduced, in some cases.

In contrast, by detecting the RF signal outputted by the RF amplifier 21 as illustrated in FIG. 10, it is possible to obtain a detection voltage that reflects a distant interfering signal in addition to a nearby interfering signal. By performing gain control of the RE amplifier 21 according to a result of the comparison between such a detection voltage and the RFGC voltage, it is possible to reduce reception failure caused by not only a nearby interfering signal but also a distant interfering signal.

<Fourth Configuration Example of OVLD Avoidance Circuit 11>

Figure 12:
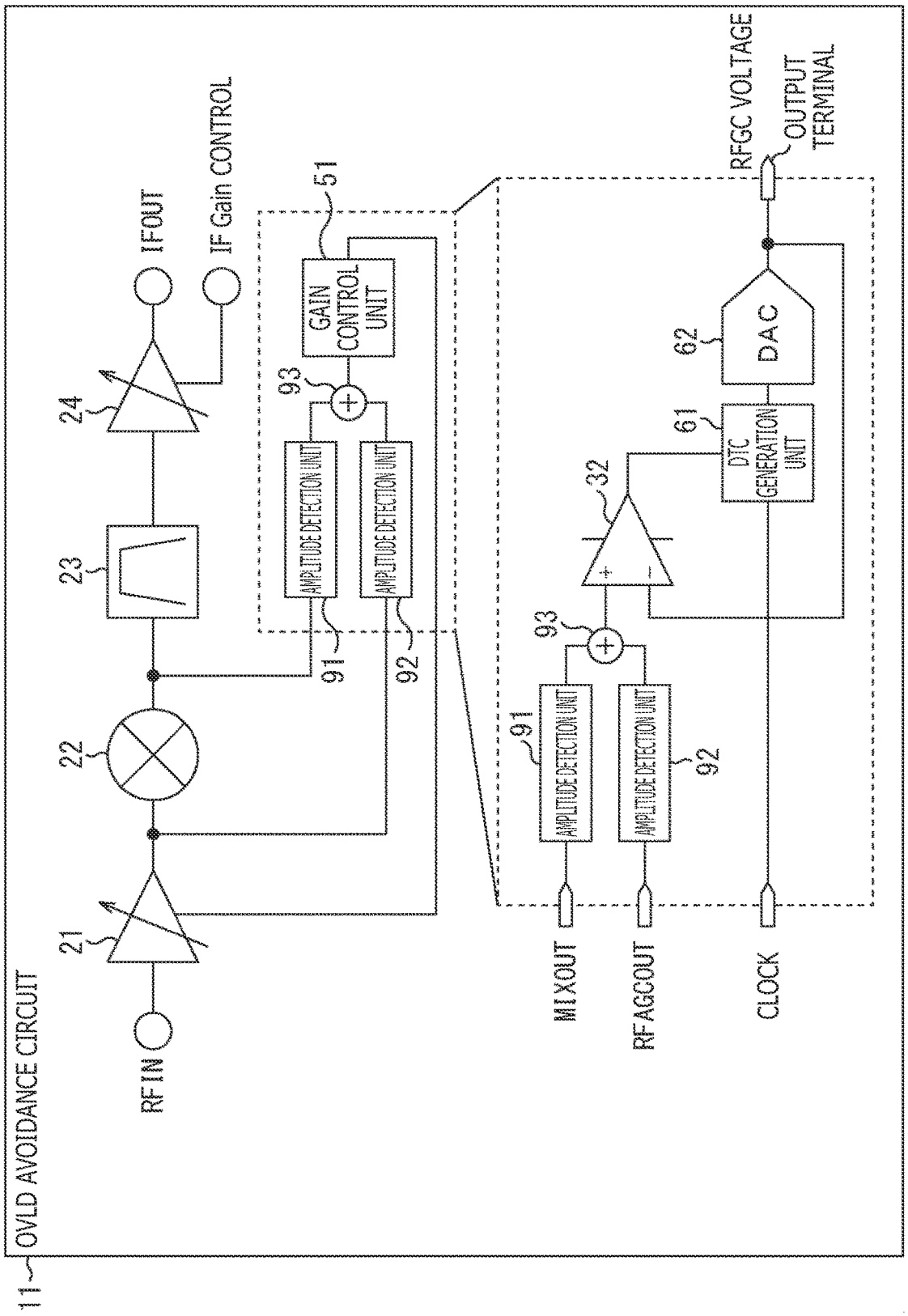
FIG. 12 is a diagram that illustrates a fourth configuration example of the OVLD avoidance circuit 11.

FIG. 12 is a diagram that illustrates a fourth configuration example of the OVLD avoidance circuit 11 illustrated in FIG. 1.

Note that, in FIG. 12, constituent elements corresponding to those in FIG. 6 are denoted by the same reference signs, and description thereof is omitted below as appropriate.

In FIG. 12, the OVLD avoidance circuit 11 has an RF amplifier 21, a mixer 22, a BPF 23, an IF amplifier 24, and a gain control unit 51.

Further, in FIG. 12, the OVLD avoidance circuit 11 has amplitude detection units 91 and 92 and an adder 93.

Accordingly, the OVLD avoidance circuit 11 in FIG. 12 has the RF amplifier 21, the mixer 22, the BPF 23, the IF amplifier 24, and the gain control unit 51 as with the OVLD avoidance circuit 11 in FIG. 6.

However, the OVLD avoidance circuit 11 in FIG. 12 differs from that in FIG. 6 in having the amplitude detection units 91 and 92 as well as the adder 93, in place of the amplitude detection unit 25.

Similarly to the amplitude detection unit 25 in FIG. 6, the amplitude detection unit 91 detects the IF signal outputted by the mixer 22 (signal which has just been outputted by the mixer 22) and outputs the level of an envelope of this IF signal as a detection voltage.

Similarly to the amplitude detection unit 25 in FIG. 10, the amplitude detection unit 92 detects the RE signal outputted by the RF amplifier 21 (signal which has just been outputted by the RF amplifier 21) and outputs the level of an envelope of this RF signal as a detection voltage.

Here, the detection voltage that is obtained by detecting the IF signal and that is outputted by the amplitude detection unit 91 is also referred to as an IF detection voltage, and the detection voltage that is obtained by detecting the RF signal and that is outputted by the amplitude detection unit 92 is also referred to as an RF detection voltage.

The adder 93 adds the IF detection voltage outputted by the amplitude detection unit 91 and the RF detection voltage outputted by the amplitude detection unit 92, and supplies an additive detection voltage (additive signal) which is a result of this addition to the gain control unit 51.

Accordingly, in the OVLD avoidance circuit 11 in FIG. 12, gain control of the RF amplifier 21 is performed according to a result of the comparison between the additive detection voltage and the RFGC voltage.

In a case where sensitivity to reception failure caused by a nearby interfering signal and sensitivity to reception failure caused by a distant interfering signal are different from each other in the receiving apparatus 10, gain control of the RF amplifier 21 is performed according to the result of comparison between the additive detection voltage and the RFGC voltage. Thus, it is possible to sufficiently reduce the reception failure caused by each of a nearby interfering signal and a distant interfering signal.

<Fifth Configuration Example of OVLD Avoidance Circuit 11>

Figure 13:
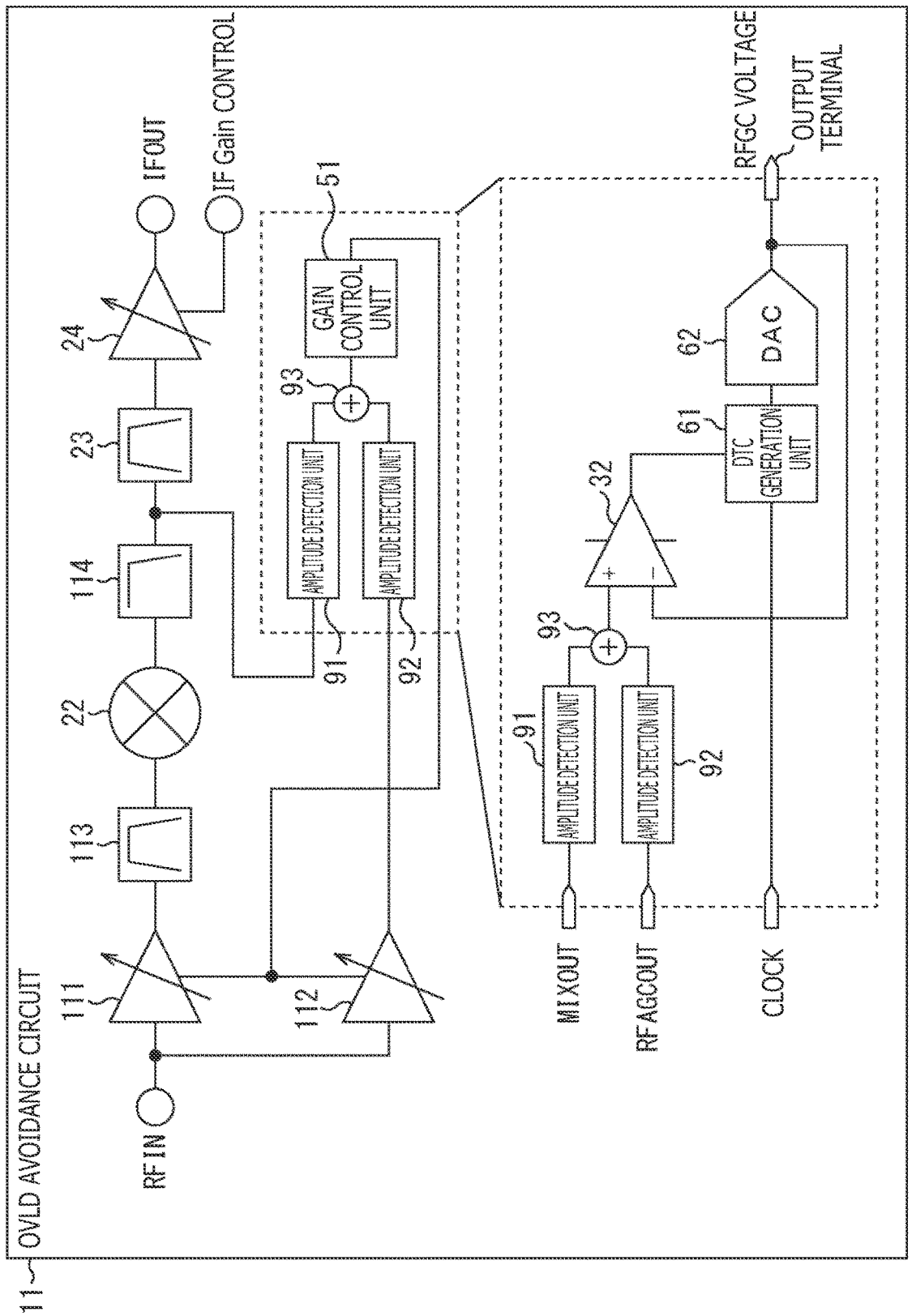
FIG. 13 is a diagram that illustrates a fifth configuration example of the OVLD avoidance circuit 11.

FIG. 13 is a diagram that illustrates a fifth configuration example of the OVLD avoidance circuit 11 illustrated in FIG. 1.

Note that, in FIG. 13, constituent elements corresponding to those in FIG. 12 are denoted by the same reference signs, and description thereof is omitted below as appropriate.

In FIG. 13, the OVLD avoidance circuit 11 has a mixer 22, a BPF 23, an IF amplifier 24, a gain control unit 51, amplitude detection units 91 and 92, and an adder 93.

Further, in FIG. 13, the OVLD avoidance circuit 11 has RF amplifiers 111 and 112, a BPF 113, and a LPF 114.

Accordingly, the OVLD avoidance circuit 11 in FIG. 13 has the mixer 22, the BPF 23, the IF amplifier 24, the gain control unit 51, the amplitude detection units 91 and 92, and the adder 93 as with the OVLD avoidance circuit 11 in FIG. 12.

However, the OVLD avoidance circuit 11 in FIG. 13 differs from that in FIG. 12 in that the RF amplifiers 111 and 112 are provided in place of the RF amplifier 21 and that the BPF 113 and the LPF 114 are additionally provided.

An RF signal is supplied to the RF amplifiers 111 and 112.

The RF amplifiers 111 and 112 have the same gain control characteristic. Similarly to the RF amplifier 21, the RF amplifiers 111 and 112 control a gain according to an RFGC voltage as a gain control signal that is supplied from the gain control unit 51, amplify the RF signal by the gain, and output the RF signal.

The RF amplifiers 111 and 112 have the same gain control characteristic and control the gain according to the same RFGC voltage. Therefore, the respective RF signals outputted by the RF amplifiers 111 and 112 are (substantially) the same RF signal.

The RF signal outputted by the RF amplifier 111 is supplied to the BPF 113, and the RF signal outputted by the RF amplifier 112 is supplied to the amplitude detection unit 92.

The BPF 113 filters the signal which has just been outputted by the RF amplifier 111, that is, the RF signal outputted by the RF amplifier 111, and outputs the filtered RF signal that has a predetermined frequency band.

The RF signal outputted by the BPF 113 is supplied to the mixer 22. The mixer 22 frequency-converts the RF signal outputted by the BPF 113 to an IF signal, and outputs the IF signal.

The IF signal outputted by the mixer 22 is supplied to the LPF 114. The LPF 114 filters the IF signal outputted by the mixer 22, and outputs the filtered IF signal that has a predetermined low frequency band.

The IF signal outputted by the LPF 114 is supplied to the BPF 23 and the amplitude detection unit 91.

Accordingly, in FIG. 13, the amplitude detection unit 91 detects the IF signal which is outputted by the mixer 22 and is then filtered by the LPF 114, and outputs an IF detection voltage obtained by this detection.

In addition, the amplitude detection unit 92 detects the RF signal outputted by the RF amplifier 112 and outputs an RF detection voltage obtained by this detection.

Then, gain control of the RF amplifiers 111 and 112 is performed according to a result of comparison between the RFGC voltage and an additive detection voltage which is obtained by adding the IF detection voltage and the RF detection voltage, as described above.

In order to improve reception quality, the OVLD avoidance circuit 11 in FIG. 13 includes the BPF 113 that filters the signal which has just been outputted by the RF amplifier 111, i.e., the RF signal outputted by the RF amplifier 111.

The BPF 113 has a frequency band of a desired signal which is set as a passband, for example. Accordingly, if the amplitude detection unit 92 detects the RF signal outputted by the BPF 113, since the RF signal is filtered in the BPF 113, the RF detection voltage obtained by this detection fluctuates according to a detuning frequency, with respect to the desired signal, held by an interfering signal included in the RF signal.

Figure 14:
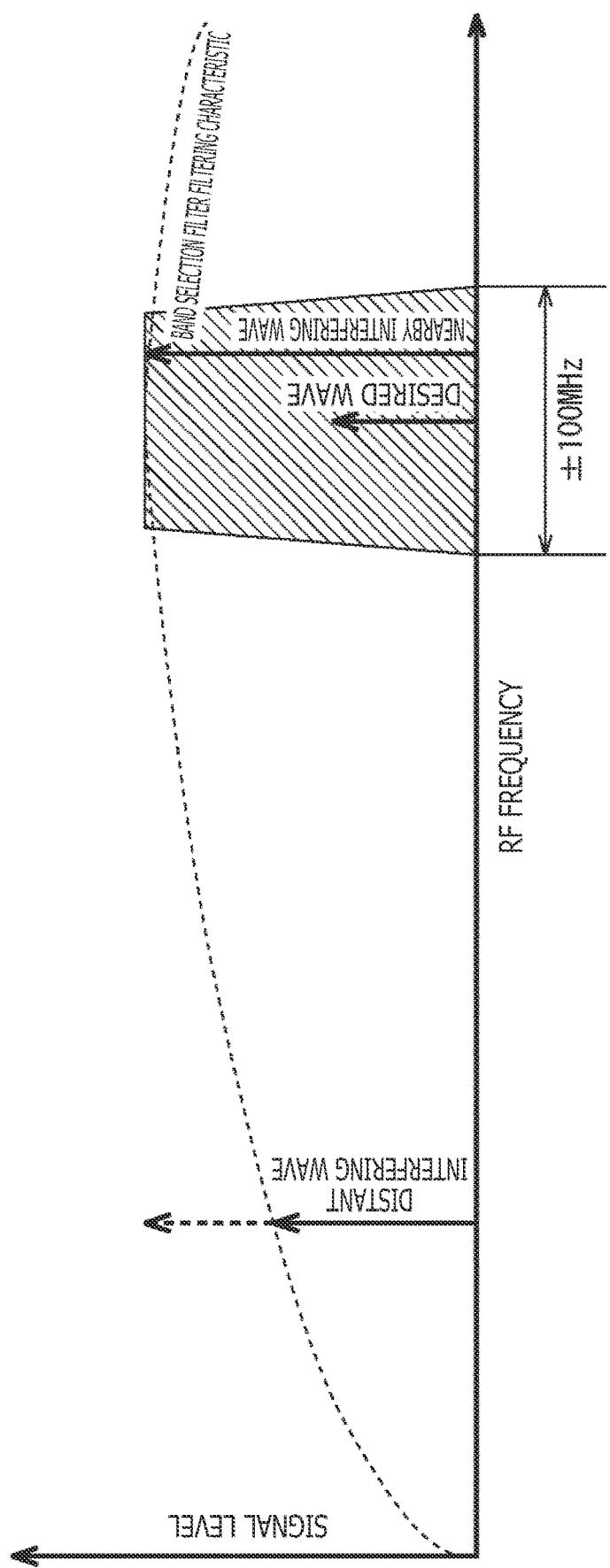
FIG. 14 is a diagram that illustrates an example of a frequency distribution of a desired signal and interfering signals.

FIG. 14 illustrates an example of a frequency distribution of a desired signal and interfering signals.

In FIG. 14, a dotted line represents a frequency characteristic (band select filter filtering characteristic) of the BPF 113.

The filtering by the BPF 113 has a small impact on a nearby interfering signal (nearby interfering wave) having a frequency close to that of a desired signal.

In contrast, the filtering by the BPF 113 has a larger impact on a distant interfering signal (distant interfering wave) having a frequency which is distant from that of the desired signal, as the detuning frequency held by the distant interfering signal is greater.

In other words, as the detuning frequency held by the distant interfering signal is greater, a level of the distant interfering signal indicated by a dotted-line arrow in FIG. 14 becomes smaller as indicated by a solid-line arrow in FIG. 14.

Accordingly, as illustrated in FIG. 13, the OVLD avoidance circuit 11 includes the RF amplifier 112 having the same gain control characteristic as the RF amplifier 111, and the RF signal outputted by the RF amplifier 112 is detected in place of the RF signal outputted by the BPF 113. As a result, it is possible to prevent the RF detection voltage obtained by this detection, from fluctuating according to a detuning frequency held by a distant interfering signal.

<Sixth Configuration Example of OVLD Avoidance Circuit 11>

Figure 15:
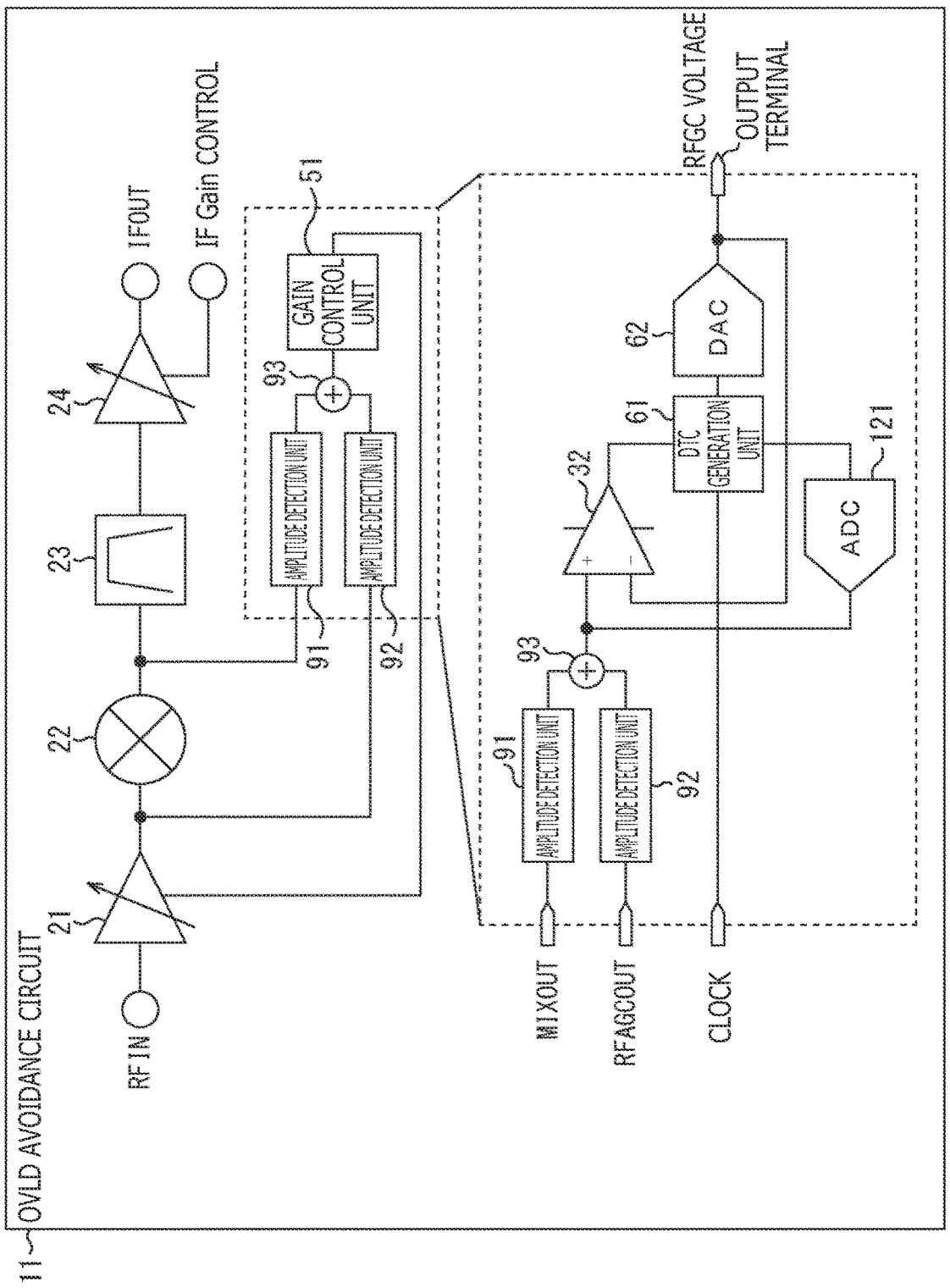
FIG. 15 is a diagram that illustrates a sixth configuration example of the OVLD avoidance circuit 11.

FIG. 15 is a diagram that illustrates a sixth configuration example of the OVLD avoidance circuit 11 illustrated in FIG. 1.

Note that, in FIG. 15, constituent elements corresponding to those in FIG. 12 are denoted by the same reference signs, and description thereof is omitted below as appropriate.

In FIG. 15, the OVLD avoidance circuit 11 has an RE amplifier 21; a mixer 22, a BPF 23, an IF amplifier 24, a gain control unit 51, amplitude detection units 91 and 92, and an adder 93.

Further, the OVLD avoidance circuit 11 in FIG. 15 has an ADC 121.

Accordingly, the OVLD avoidance circuit 11 in FIG. 15 has the RF amplifier 21, the mixer 22, the BPF 23, the IF amplifier 24, the gain control unit 51, the amplitude detection units 91 and 92, and the adder 93 as with the OVLD avoidance circuit 11 in FIG. 12.

However, the OVLD avoidance circuit 11 in FIG. 15 differs from that in FIG. 12 in that the ADC 121 is additionally provided.

An additive detection voltage is supplied from the adder 93 to the ADC 121.

The ADC 121 AD-converts the additive detection voltage supplied from the adder 93 to a digital signal, and supplies the digital signal to the DTC generation unit 61.

In the DTC generation unit 61 (in FIG. 7), when the attack state is first entered after a reset, the accumulator 71 sets, as a prediction value for the convergence value of the RFGC voltage (the additive detection voltage), a value corresponding to an additive detection voltage that is the digital signal output from the ADC 121, to an initial value for the count value.

For example, the accumulator 71 obtains, as a prediction value for the convergence value of the RFGC voltage, a value obtained by multiplying the additive detection voltage that is the digital signal from the ADC 121, by a predetermined coefficient, and sets this prediction value to the initial value for the count value.

Accordingly, in FIG. 15, because counting of the count value is started by use of the prediction value for the convergence value of the RFGC voltage as an initial value, it is possible to further shorten the convergence time required for the RFGC voltage to converge.

Note that the ADC 121 starts operating at a time of a reset and stops operating after the initial value for the count value is set. The ADC 121 subsequently starts (resumes) operating when the OVLD avoidance circuit 11 is reset and the attack state is then entered.

<Seventh Configuration Example of OVLD Avoidance Circuit 11>

FIG. 16 is a diagram that illustrates a seventh configuration example of the OVLD avoidance circuit 11 illustrated in FIG. 1.

Note that, in FIG. 16, constituent elements corresponding to those in FIG. 15 are denoted by the same reference signs, and description thereof is omitted below as appropriate.

In FIG. 16, the OVLD avoidance circuit 11 has an RF amplifier 21, a mixer 22, a BPF 23, an IF amplifier 24, a gain control unit 51, amplitude detection units 91 and 92, and an adder 93.

Further, the OVLD avoidance circuit 11 in FIG. 16 has a comparator 131.

Accordingly, the OVLD avoidance circuit 11 in FIG. 16 has the RF amplifier 21, the mixer 22, the BPF 23, the IF amplifier 24, the gain control unit 51, the amplitude detection units 91 and 92, and the adder 93 as with the OVLD avoidance circuit 11 in FIG. 15.

However, the OVLD avoidance circuit 11 in FIG. 16 differs from that in FIG. 15 in that the ADC 121 is not provided and that the comparator 131 is additionally provided.

The comparator 131 compares the RFGC voltage outputted by the DAC 62 with the additive detection voltage outputted by the adder 93, and outputs an H level or an L level representing a result of the comparison.

Here, the accumulator 71 included in the DTC generation unit 61 (in FIG. 7) has an unillustrated register for storing the count value.

The DTC generation unit 61 in FIG. 16 has an SAR sequencer (not illustrated) that controls (the value in) the register of the accumulator 71 according to the output from the comparator 131. An SAR (successive approximation register) includes the SAR sequencer and the register of the accumulator 71.

In FIG. 16, a successive-approximation ADC includes the SAR in the DTC generation unit 61, the DAC 62, and the comparator 131.

In such a successive-approximation ADC, the additive detection voltage which is the output from the adder 93 and which is supplied to the comparator 131 is subjected to an AD conversion. In the successive-approximation ADC, the result of the AD conversion, i.e., a digital additive detection voltage, is set in the register of the accumulator 71.

In the DTC generation unit 61, similarly to the case in FIG. 15, the accumulator 71 sets, as a prediction value for the convergence value of the RFGC voltage, a value corresponding to an additive detection voltage that is a digital signal, to an initial value for the count value.

Accordingly, similarly to FIG. 15, in FIG. 16, because counting of the count value is started by use of the prediction value for the convergence value of the RFGC voltage as an initial value, it is possible to further shorten the convergence time required for the RFGC voltage to converge.

Further, in FIG. 16, because the successive-approximation ADC includes the accumulator 71 in the DTC generation unit 61 and the DAC 62, it is possible to simplify the circuit in comparison to the case of providing the ADC 121 alone as illustrated in FIG. 15.

Note that, similarly to the ADC 121 in FIG. 15, the successive-approximation ADC in FIG. 16 starts operating at a time of a reset and stops operating (as the successive-approximation ADC) after the initial value for the count value is set. The successive-approximation ADC subsequently starts operating when the OVLD avoidance circuit 11 is reset and the attack state is then entered.

Figure 17:
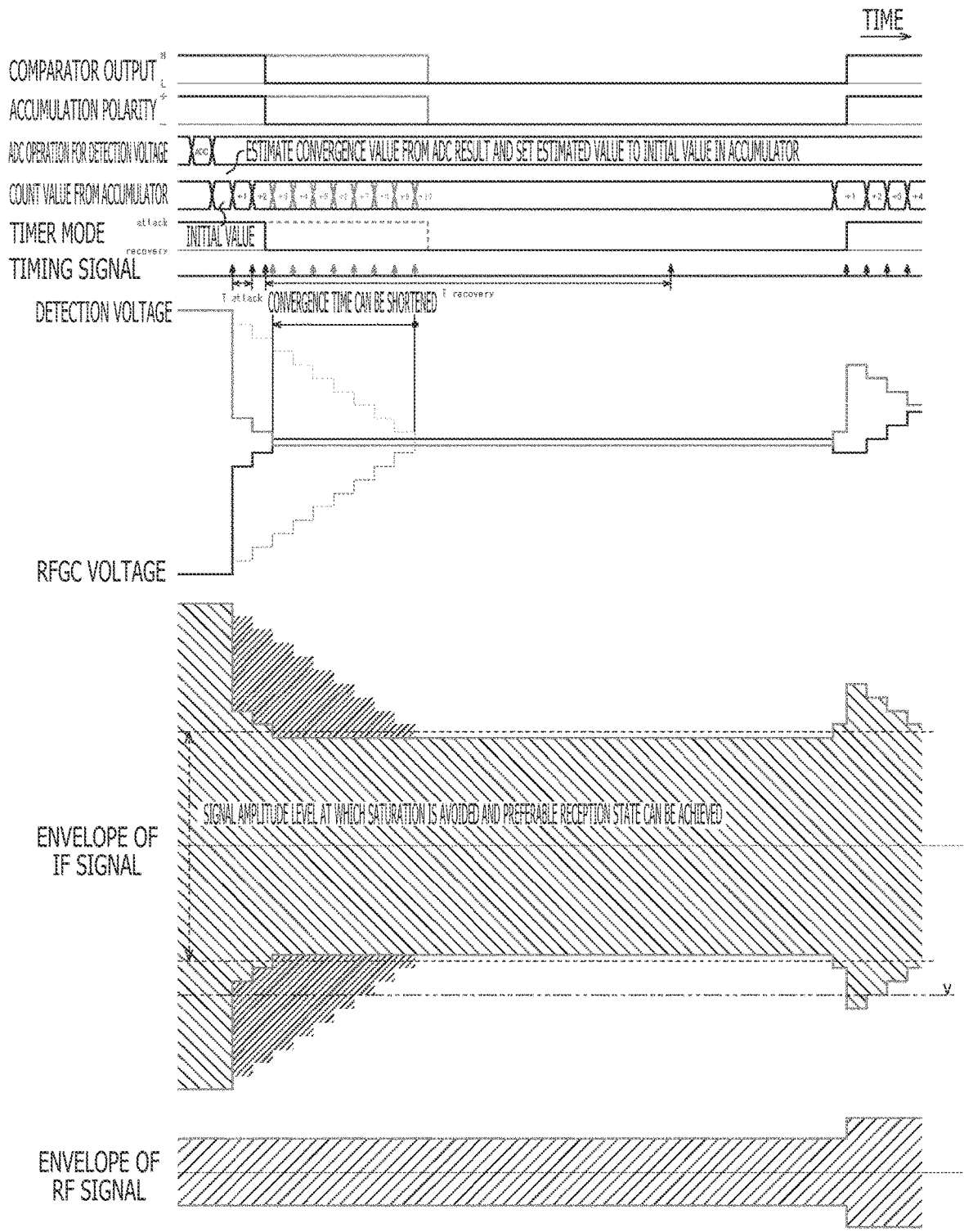
FIG. 17 is a timing chart for describing an example of operation performed by the OVLD avoidance circuit 11.

FIG. 17 is a timing chart for describing an example of operation performed by the OVLD avoidance circuits 11 in FIG. 15 and FIG. 16.

Similarly to FIG. 9, FIG. 17 illustrates, the output from the comparator 32 (comparator output), the accumulation polarity of the accumulator 71, the count value from the accumulator 71, the timer mode of the timer 72, the timing signal outputted by the timer 72, the detection voltage outputted by the amplitude detection unit 25, the RFGC voltage outputted by the DAC 62, the envelope of the IF signal outputted by the mixer 22, and the envelope of the RF signal outputted by the RF amplifier 21.

Further, FIG. 17 also illustrates a timing at which the ADC 121 in FIG. 15 and the successive-approximation ADC in FIG. 16 perform an ADC operation (ADC operation for detection voltage) to AD-convert the detection voltage (additive detection voltage).

The operation performed by the OVLD avoidance circuit 11 in FIG. 15 will be described below. The following description is also applied to the operation performed by the OVLD avoidance circuit 11 in FIG. 16, with the "ADC 121" replaced with the "successive-approximation ADC."

The OVLD avoidance circuit 11 is reset when starting the operation, and enters the attack state after the reset. The ADC 121 starts an AD conversion of the detection voltage (additive detection voltage) from the adder 93.

Subsequently, the accumulator 71 obtains, from the output from the ADC 121, a prediction value for the convergence value of the RFGC voltage, and sets the prediction value to the initial value for the count value.

Subsequent operation is similar to that in FIG. 9, and therefore, description thereof is omitted.

As described above, the accumulator 71 sets the prediction value for the convergence value of the RFGC voltage to an initial value for the count value, and starts counting of the count value. Thus, it is possible to further shorten the convergence time required for the RFGC voltage to converge.

In other words, by obtaining the prediction value for the convergence value of the RFGC voltage from a value resulting from the AD conversion of the detection voltage, it is possible to obtain a prediction value that is comparatively close to the true convergence value. Further, by setting such a prediction value to the initial value for the count value in the accumulator 71; the RFGC voltage outputted by the DAC 62, which DA-converts the count value, becomes a voltage that is close to the true convergence value. As a result, in comparison to a case of setting the initial value for the count value without using the value resulting from the AD conversion of the detection voltage, the RFGC voltage converges in a shorter amount of time.

FIG. 17 illustrates an example of a count value in a case where the prediction value for the convergence value of the RFGC voltage which is obtained by using the value resulting from the AD conversion of the detection voltage is set to the initial value for the count value, and a count value in a case where the initial value for the count value is set without using the value resulting from the AD conversion of the detection voltage.

In FIG. 17, in a case where the prediction value for the convergence value of the RFGC voltage which is obtained by using the value resulting from the AD conversion of the detection voltage is set to the initial value for the count value, the RFGC voltage converges at the second count of the count value.

In contrast, in a case where the initial value for the count value is set without using the value resulting from the AD conversion of the detection voltage in FIG. 17, nine counts are required for the REGC voltage to converge.

<Eighth Configuration Example of OVLD Avoidance Circuit 11>

FIG. 18 is a diagram that illustrates an eighth configuration example of the OVLD avoidance circuit 11 illustrated in FIG. 1.

Note that, in FIG. 18, constituent elements corresponding to those in FIG. 2 or in FIG. 6 and FIG. 8 are denoted by the same reference signs, and description thereof is omitted below as appropriate.

In FIG. 18, the OVLD avoidance circuit 11 has an RF amplifier 21, a mixer 22, a BPF 23, an IF amplifier 24, an amplitude detection unit 25, a comparator 32, a DAC 62, an accumulator 71, and a timer 72.

The OVLD avoidance circuit 11 also has a direct-current power supply 33, a switch SW, a resistor R1, a capacitor C, and a resistor R2.

In addition, the OVLD avoidance circuit 11 has switches 151 and 152.

Accordingly, the OVLD avoidance circuit 11 in FIG. 18 has the RF amplifier 21, the mixer 22, the BPF 23, the IF amplifier 24, the amplitude detection unit 25, the comparator 32, the DAC 62, the accumulator 71, and the timer 72 as with the OVLD avoidance circuits 11 in FIG. 6 and FIG. 8.

Further, the OVLD avoidance circuit 11 in FIG. 18 has the RF amplifier 21, the mixer 22, the BPF 23, the IF amplifier 24, the amplitude detection unit 25, the comparator 32, the direct-current power supply 33, the switch SW, the resistor R1, the capacitor C, and the resistor R2 as with the OVLD avoidance circuit 11 in FIG. 2.

However, the OVLD avoidance circuit 11 in FIG. 18 differs from those in FIG. 2, FIG. 6, and FIG. 8 in that the switches 151 and 152 are additionally provided.

The OVLD avoidance circuit 11 in FIG. 18 is configured to selectively perform, as the gain control of the RF amplifier 21, gain control by the SW method and gain control by the count method.

The switch 151 selects one of the connection point between the capacitor C and the resistor R1 and the output terminal of the DAC 62, and the connects the selected one to a gain control terminal for gain control of the RF amplifier 21.

The switch 152 selects one of an on/off control terminal for on/off control of the switch SW and the accumulator 71 as well as the timer 72, and connects the selected one to the output terminal of the comparator 32.

The switches 151 and 152 operate in conjunction with each other according to an operation made by an external unit, for example.

In other words, in a case where the switch 151 selects the connection point between the capacitor C and the resistor R1, the switch 152 selects the on/off control terminal of the switch SW.

In addition, in a case where the switch 151 selects the output terminal of the DAC 62, the switch 152 selects the accumulator 71 and the timer 72.

In a case where the switch 151 selects the connection point between the capacitor C and the resistor R1 and the switch 152 selects the on/off control terminal of the switch SW, the OVLD avoidance circuit 11 has substantially a similar configuration to that in FIG. 2 and performs gain control by the SW method.

In other words, in this case, the voltage of the capacitor C is selected as the RFGC voltage in the switch 151 and is supplied to the RF amplifier 21.

In contrast, in a case where the switch 151 selects the output terminal of the DAC 62 and the switch 152 selects the accumulator 71 and the timer 72, the OVLD avoidance circuit 11 has substantially a similar configuration to those in FIG. 6 and FIG. 8 and performs gain control by the count method.

In other words, in this case, the output from the DAC 62 is selected as the RFGC voltage in the switch 151 and is supplied to the RF amplifier 21.

By virtue of the OVLD avoidance circuit 11 in FIG. 18, according to a characteristic, intended use, etc., for the receiving apparatus 10, it is possible to select an appropriate method from among the SW method and the count method and perform gain control by the selected method.

For example, in a case where the receiving apparatus 10 is a system having high sensitivity to reception quality deterioration with respect to stepwise change of the gain, the SW method may maintain better reception quality than the count method.

Accordingly, the OVLD avoidance circuit 11 in FIG. 18 can perform gain control by the SW method in the case where the receiving apparatus 10 is a system having high sensitivity to reception quality deterioration with respect to stepwise change of the gain. In contrast, it is possible to perform gain control by the count method in the case where the receiving apparatus 10 is not a system having high sensitivity to reception quality deterioration with respect to stepwise change of the gain.

In addition, the OVLD avoidance circuit 11 in FIG. 18 has a circuit configuration in which, from among blocks necessary for gain control, the amplitude detection unit 25 and the comparator 32 are shared by the SW method and the count method.

Accordingly, the OVLD avoidance circuit 11 in FIG. 18 can be configured by adding a few circuit components to the OVLD avoidance circuit 11 in FIG. 2 or FIG. 6 and FIG. 8.

FIG. 19 illustrates an example of the RFGC voltage and the detection voltage that corresponds to the RF signal as an interfering signal.

A of FIG. 19 illustrates a detection voltage corresponding to an intermittent interfering signal, and also illustrates an RFGC voltage in a case where gain control has been performed by the SW method. A of FIG. 19 is the same figure as B of FIG. 5.

In the case where gain control is performed by the SW method, for an intermittent interfering signal, the RFGC voltage takes on a serrated waveform and does not stabilize as described in B of FIG. 5.

B of FIG. 19 illustrates a detection voltage corresponding to an intermittent interfering signal, and also illustrates an REGC voltage in a case where gain control has been performed by the count method.

In a case where gain control is performed by the count method, for an intermittent interfering signal, by setting a short attack period Tattack, the RFGC voltage quickly converges in a period of time in which the interfering signal is present.

In addition, by setting the recovery period Trecovery sufficiently longer than the attack period Tattack, for example, substantially equivalent to a period of time in which an interfering signal is not present, the RFGC voltage more or less does not decrease in the period of time in which an interfering signal is not present.

Accordingly, for an intermittent interfering signal, the RFGC voltage quickly converges in the first period of time in which an interfering signal is present, and is then substantially stable. Therefore, it is possible to shorten the attack time and lengthen the recovery time.

As described above, with the count method, the comparator 32 compares the signal outputted by the RF amplifier 21 (detection voltage of RF signal or IF signal) and (RFGC voltage obtained by DA-converting) the count value outputted by the accumulator 71, the accumulator 71 counts the count value according to the output from the comparator 32, and the RF amplifier 21 controls the gain and amplifies the RF signal according to (the RFGC voltage obtained by DA-converting) the count value. Therefore, it is possible to appropriately perform gain control on various interfering signals without providing a capacitor C and a resistor R2 that are externally attached.

For example, by setting a short attack period Tattack, which is a timing at which the count value is incremented, it is possible to cause the RFGC voltage to converge promptly (in a short amount of time) and shorten the attack time.

By setting the initial value for the count value to an appropriate initial value (for example, a prediction value for the convergence value of the RFGC voltage obtained experimentally) according to, for example, the circuit configuration of the OVLD avoidance circuit 11; it is possible to further shorten the attack time.

By predicting the convergence value of the RFGC voltage from a result of the AD conversion of the detection voltage as in FIG. 15 and FIG. 16, a prediction value for a convergence value is obtained with high accuracy and is set to the initial value for the count value. Thus, it is possible to significantly shorten the attack time. In other words, it is possible to cause the OVLD avoidance circuit 11 to stabilize in a very short amount of time.

By setting the recovery period Trecovery, which is a timing at which the count value is decremented, sufficiently longer than the attack period Tattack, for example, it is possible to significantly lengthen the recovery time.

By lengthening the recovery time, for an intermittent interfering signal, it is possible to suppress a decrease of the RFGC voltage in a period of time in which the interfering signal is not present, and prevent the RFGC voltage from having a waveform in which the amplitude is in a greatly serrated shape as illustrated in B of FIG. 5.

Accordingly, it is possible to handle an interfering signal (profile) that cannot be handled with the SW method. In other words, with respect to an intermittent interfering signal for which it is difficult to generate a stable RFGC voltage by the SW method, it is possible to reduce fluctuation of the RFGC voltage, generate a stable RFGC voltage, and have stable reception.

Further, by virtue of the count method, it is possible to fabricate a robust OVLD avoidance circuit 11 that is not adversely affected by component variation.

Note that the OVLD avoidance circuit 11 can be configured by combining components of any one of the first configuration example through the eighth configuration example with components of another configuration example to the extent feasible.

For example, the OVLD avoidance circuit 11 can be configured by combining the ADC 121 of the sixth configuration example in FIG. 15 with the components of the eighth configuration example in FIG. 18.

In addition, embodiments of the present technique are not limited to the embodiments described above, and various modifications are possible in a range that does not deviate from the substance of the present technique.

In addition, effects described in the present specification are merely examples, and there is no limitation thereto. There may be other effects.

Note that the present technique can have the following configurations.

<1>
A signal processing apparatus including:
an amplifier that controls a gain according to a count value to amplify a signal;
a comparator that compares the signal outputted by the amplifier with the count value; and
an accumulator that counts the count value according to an output from the comparator.

<2>
The signal processing apparatus according to <1>, in which
the accumulator increments or decrements the count value according to the output from the comparator.

<3>
The signal processing apparatus according to <1> or <2>, in which
according to the output from the comparator, the accumulator counts the count value at a first interval or a second interval different from the first interval.

<4>
The signal processing apparatus according to any one of <1> through <3>, further including:
a DAC that performs a DA conversion on the count value, in which the amplifier controls the gain according to an output from the DAC, and
the comparator compares the signal outputted by the amplifier with the output from the DAC.

<5>
The signal processing apparatus according to <4>, further including:
a mixer that performs a frequency conversion on the signal outputted by the amplifier, in which
the comparator compares the signal outputted by the mixer with the output from the DAC.

<6>>
The signal processing apparatus according to <5>, further including:
a scaler that scales the signal outputted by the mixer, in which
the comparator compares the signal outputted by the scaler with the output from the DAC.

<7>
The signal processing apparatus according to any one of <4> through <6>, in which
a state in which the signal outputted by the amplifier is greater than the output from the DAC is set to an attack state, and a state in which the signal outputted by the amplifier is not greater than the output from the DAC is set to a recovery state, and
the accumulator performs one of incrementing and decrementing of the count value in the attack state, and performs the other one of incrementing and decrementing in the recovery state.

<8>>
The signal processing apparatus according to <7>, in which
the accumulator counts the count value at a first interval in the attack state and counts the count value at a second interval longer than the first interval in the recovery state.

<9>
The signal processing apparatus according to <8>, in which
the first interval and the second interval are able to be set from an external unit.

<10>
The signal processing apparatus according to <5> or <6>, in which
the comparator compares an additive signal with the output from the DAC, the additive signal being obtained by adding a signal that has just been outputted by the amplifier and a signal that has just been outputted by the mixer.

<11>
The signal processing apparatus according to <5>, further including:
a BPF that filters a signal that has just been outputted by the amplifier; and
another amplifier that controls the gain according to the output from the DAC to amplify the signal and has the same gain control characteristic as the amplifier, in which
the comparator compares an additive signal with the output from the DAC, the additive signal being obtained by adding the signal outputted by the mixer and the signal outputted by the another amplifier.

<12>
The signal processing apparatus according to any one of <4> through <11>, further including:
an ADC that performs an AD conversion on the signal outputted by the amplifier, in which
the accumulator sets a value corresponding to an output from the ADC to an initial value for the count value.

<13>
The signal processing apparatus according to <12>, in which
the ADC is a successive-approximation ADC including the accumulator, the DAC, and another comparator that compares the output from the DAC with the signal outputted by the amplifier.

<14>
The signal processing apparatus according to any one of <4> through <13>, further including:
a capacitor to which a voltage is applied or is not applied according to the output from the comparator;
a resistor connected in parallel to the capacitor; and
a switch that selects the output from the DAC or a voltage of the capacitor and supplies the selected one as a gain control signal to the amplifier.

<15>
A signal processing method including:
controlling, by an amplifier, a gain according to a count value to amplify a signal;
comparing, by a comparator, the signal outputted by the amplifier with the count value; and
counting, by an accumulator, the count value according to an output from the comparator.

<16>
A receiving apparatus including:
an amplifier that controls a gain according to a count value to amplify a signal;
a comparator that compares the signal outputted by the amplifier with the count value;
an accumulator that counts the count value according to an output from the comparator; and
a demodulation circuit that demodulates the signal outputted by the amplifier.

REFERENCE SIGNS LIST

10: Receiving apparatus
11: OVLD avoidance circuit
12: ADC
13: Demodulation circuit
21: RF amplifier
22: Mixer
23: BPF
24: IF amplifier
25: Amplitude detection unit
26: Gain control unit
31: Peak hold unit
32: Comparator
33: Direct-current power supply
51: Gain control unit
61: DTC generation unit
62: DAC
71: Accumulator
72: Timer
81: Amplitude scaler
91, 92: Amplitude detection unit
93: Adder
111, 112: RF amplifier
113; BPF
114: LPF
121: ADC
131: Comparator
151, 152: Switch

The invention claimed is:
1. A signal processing apparatus comprising:
an amplifier that controls a gain according to a count value to amplify a signal;
a comparator that compares the signal outputted by the amplifier with the count value; and
an accumulator that counts the count value according to an output from the comparator.

2. The signal processing apparatus according to claim 1, wherein
the accumulator increments or decrements the count value according to the output from the comparator.

3. The signal processing apparatus according to claim 1, wherein
according to the output from the comparator, the accumulator counts the count value at a first interval or a second interval different from the first interval.

4. The signal processing apparatus according to claim 1, further comprising:
a digital to analog converter that performs a digital to analog conversion on the count value, wherein
the amplifier controls the gain according to an output from the DAC, and
the comparator compares the signal outputted by the amplifier with the output from the DAC.

5. The signal processing apparatus according to claim 4, further comprising:
a mixer that performs a frequency conversion on the signal outputted by the amplifier, wherein
the comparator compares the signal outputted by the mixer with the output from the digital to analog converter.

6. The signal processing apparatus according to claim 5, further comprising:
a scaler that scales the signal outputted by the mixer, wherein
the comparator compares the signal outputted by the scaler with the output from the digital to analog converter.

7. The signal processing apparatus according to claim 4, wherein
a state in which the signal outputted by the amplifier is greater than the output from the digital to analog converter is set to an attack state, and a state in which the signal outputted by the amplifier is not greater than the output from the digital to analog converter is set to a recovery state, and
the accumulator performs one of incrementing and decrementing of the count value in the attack state, and performs the other one of incrementing and decrementing in the recovery state.

8. The signal processing apparatus according to claim 7, wherein
the accumulator counts the count value at a first interval in the attack state and counts the count value at a second interval longer than the first interval in the recovery state.

9. The signal processing apparatus according to claim 8, wherein
the first interval and the second interval are able to be set from an external unit.

10. The signal processing apparatus according to claim 5, wherein
the comparator compares an additive signal with the output from the digital to analog converter, the additive signal being obtained by adding a signal that has just been outputted by the amplifier and a signal that has just been outputted by the mixer.

11. The signal processing apparatus according to claim 5, further comprising:
a band pass filter that filters a signal that has just been outputted by the amplifier; and
another amplifier that controls the gain according to the output from the digital to analog converter to amplify the signal and has a same gain control characteristic as the amplifier, wherein
the comparator compares an additive signal with the output from the digital to analog converter, the additive signal being obtained by adding the signal outputted by the mixer and the signal outputted by the another amplifier.

12. The signal processing apparatus according to claim 4, further comprising:
an analog to digital converter that performs an analog to digital conversion on the signal outputted by the amplifier, wherein
the accumulator sets a value corresponding to an output from the ADC to an initial value for the count value.

13. The signal processing apparatus according to claim 12, wherein
the analog to digital converter is a successive-approximation analog to digital converter including the accumulator, the digital to analog converter, and another comparator that compares the output from the digital to analog converter with the signal outputted by the amplifier.

14. The signal processing apparatus according to claim 4, further comprising:
a capacitor to which a voltage is applied or is not applied according to the output from the comparator;
a resistor connected in parallel to the capacitor; and
a switch that selects the output from the digital to analog converter or a voltage of the capacitor and supplies the selected one as a gain control signal to the amplifier.

15. A signal processing method comprising:
controlling, by an amplifier, a gain according to a count value to amplify a signal;
comparing, by a comparator, the signal outputted by the amplifier with the count value; and
counting, by an accumulator, the count value according to an output from the comparator.

16. A receiving apparatus comprising:
an amplifier that controls a gain according to a count value to amplify a signal;
a comparator that compares the signal outputted by the amplifier with the count value;
an accumulator that counts the count value according to an output from the comparator; and
a demodulation circuit that demodulates the signal outputted by the amplifier.

* * * * *